(12) United States Patent
Choi

(10) Patent No.: US 12,063,777 B2
(45) Date of Patent: Aug. 13, 2024

(54) SEMICONDUCTOR DEVICE AND METHOD OF MANUFACTURING SEMICONDUCTOR DEVICE

(71) Applicant: SK hynix Inc., Icheon-si Gyeonggi-do (KR)

(72) Inventor: Kang Sik Choi, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 435 days.

(21) Appl. No.: 17/344,630

(22) Filed: Jun. 10, 2021

(65) Prior Publication Data
US 2022/0173117 A1     Jun. 2, 2022

(30) Foreign Application Priority Data

Dec. 1, 2020 (KR) .......................... 10-2020-0166046

(51) Int. Cl.
*H10B 43/27* (2023.01)
*H10B 41/10* (2023.01)
*H10B 41/27* (2023.01)
*H10B 43/10* (2023.01)

(52) U.S. Cl.
CPC ............. *H10B 41/27* (2023.02); *H10B 41/10* (2023.02); *H10B 43/10* (2023.02); *H10B 43/27* (2023.02)

(58) Field of Classification Search
CPC ................................ H10B 43/27; H10B 43/20
See application file for complete search history.

(56) References Cited

U.S. PATENT DOCUMENTS

| 9,859,298 | B1 | 1/2018 | Pang et al. |
| 10,438,962 | B2 | 10/2019 | Kim |
| 2020/0388634 | A1* | 12/2020 | Jung ................. H01L 29/40114 |
| 2021/0265385 | A1* | 8/2021 | Rajashekhar .......... H10B 43/10 |

FOREIGN PATENT DOCUMENTS

KR    1020130037063 A    4/2013

* cited by examiner

*Primary Examiner* — Christopher A Johnson
(74) *Attorney, Agent, or Firm* — WILLIAM PARK & ASSOCIATES LTD.

(57) ABSTRACT

A method of manufacturing a semiconductor device may include forming a stack with alternately stacked first material layers and second material layers, forming a first opening that passes through the stack, forming a blocking layer in the first opening, forming a data storage layer in the blocking layer, forming a slit passing through the stack, forming second openings by selectively removing the second material layers through the slit, selectively forming a protective layer on exposed surfaces of the first material layers, etching the blocking layer through the second openings, oxidizing the protective layer, and forming insulating layers in the second openings.

13 Claims, 38 Drawing Sheets

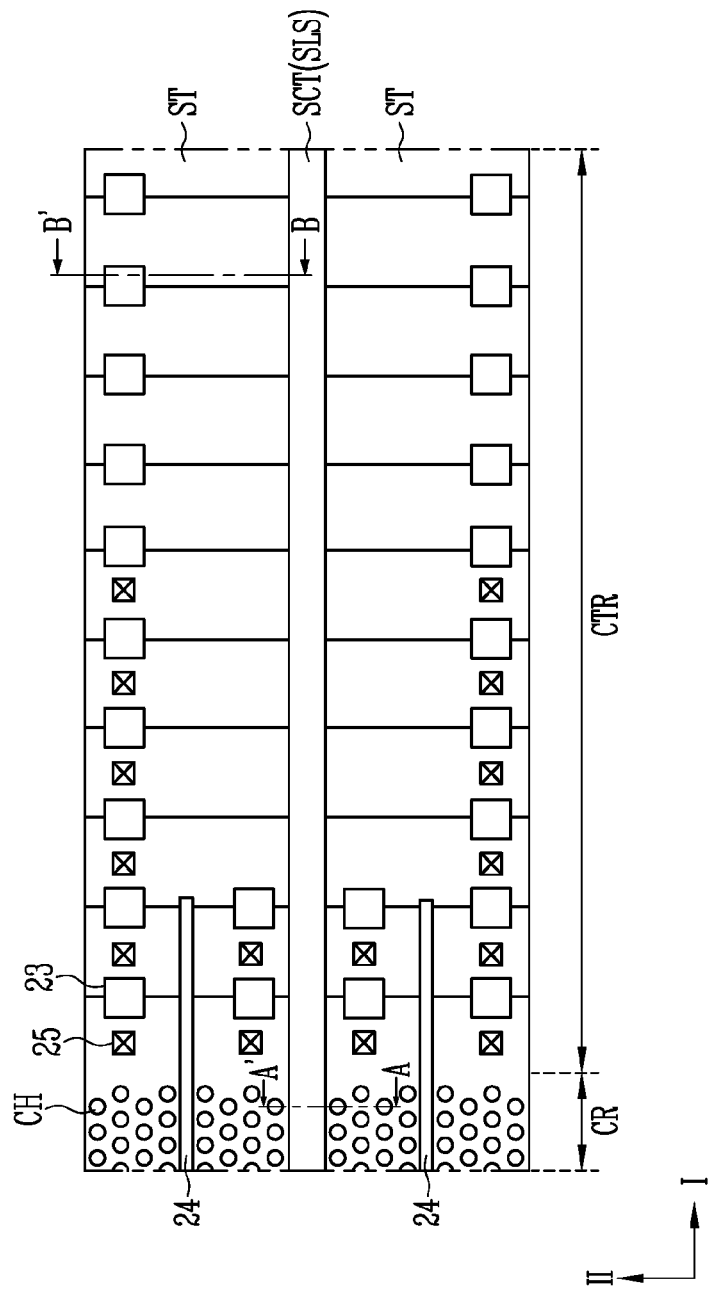

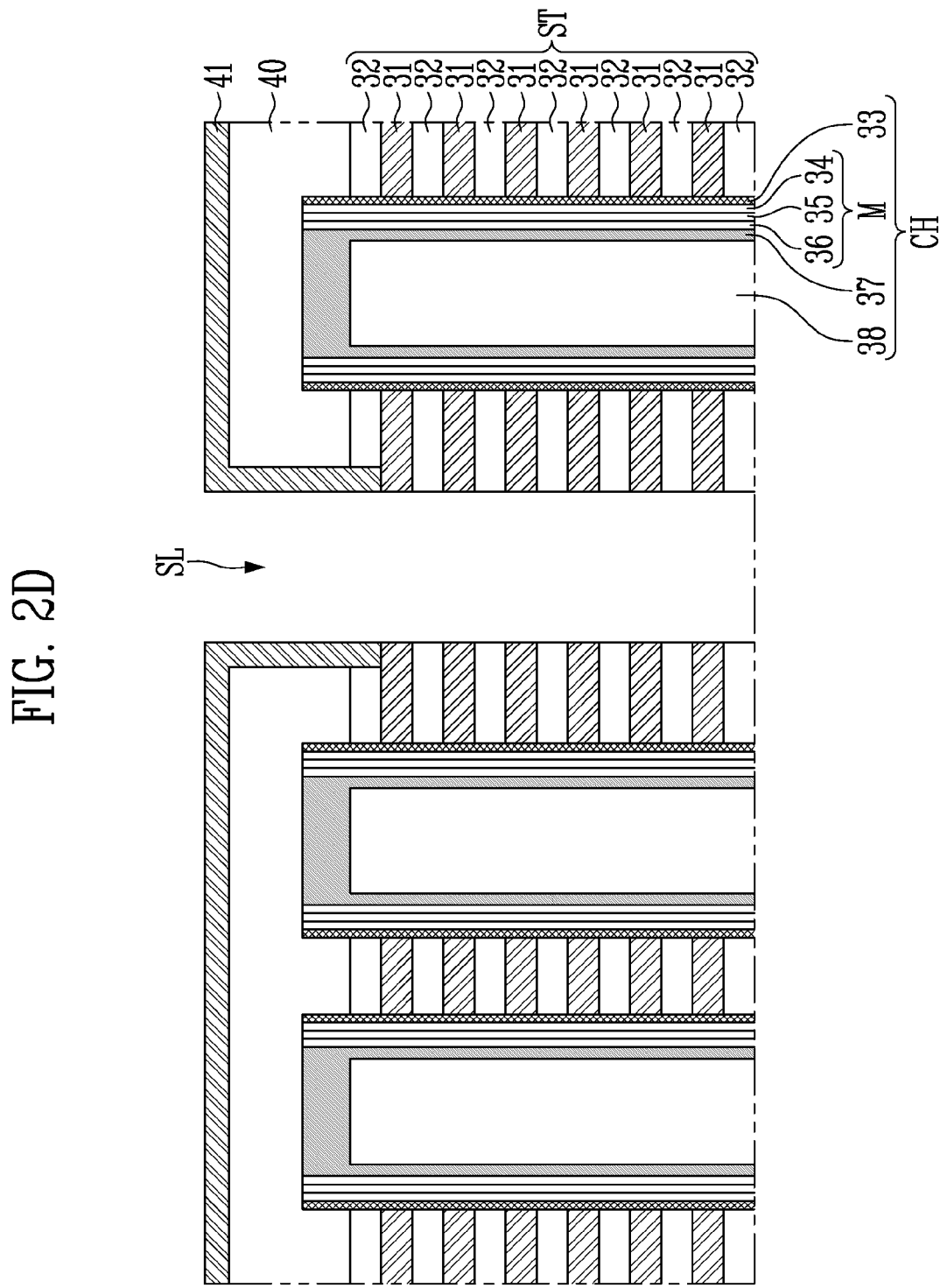

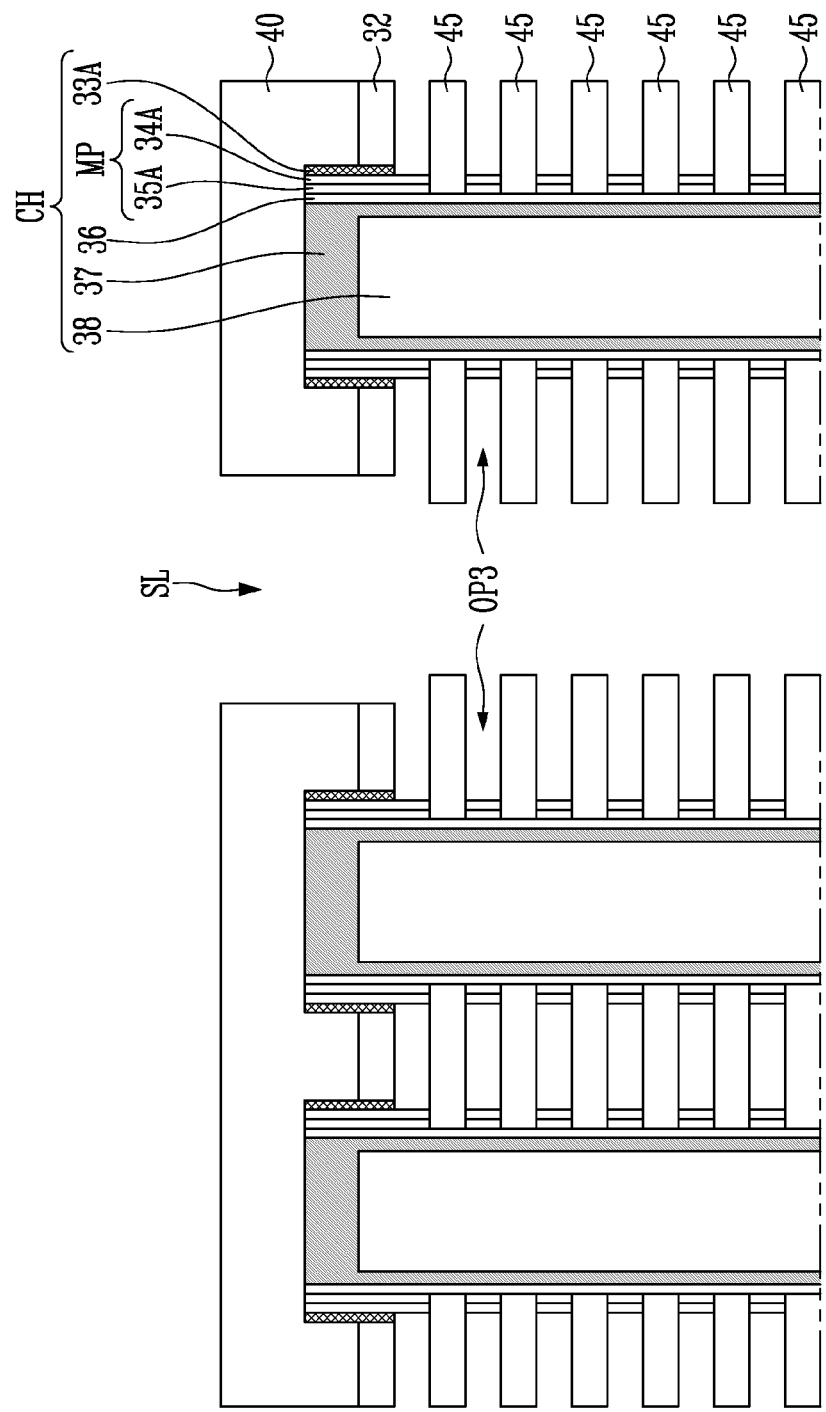

SEMICONDUCTOR DEVICE AND METHOD OF MANUFACTURING SEMICONDUCTOR DEVICE

CROSS-REFERENCE TO RELATED APPLICATION

The present application claims priority under 35 U.S.C. § 119(a) to Korean patent application number 10-2020-0166046, filed on Dec. 1, 2020, in the Korean Intellectual Property Office, the entire disclosure of which is incorporated herein by reference.

BACKGROUND

1. Technical Field

The present disclosure relates to an electronic device, and more particularly, to a semiconductor device and a method of manufacturing the semiconductor device.

2. Related Art

A degree of integration of a semiconductor device is mainly determined by an area occupied by a unit memory cell. Recently, as a degree of integration of a semiconductor device forming a memory cell in a single layer on a substrate reaches a limit, a three-dimensional semiconductor device in which memory cells are stacked on a substrate is being proposed. In addition, in order to improve operation reliability of the semiconductor device, various structures and manufacturing methods are being developed.

SUMMARY

According to an embodiment of the present disclosure, a method of manufacturing a semiconductor device may include forming a stack with alternately stacked first material layers and second material layers, forming a first opening that passes through the stack, forming a blocking layer in the first opening, forming a data storage layer in the blocking layer, forming a slit passing through the stack, forming second openings by selectively removing the second material layers through the slit, selectively forming a protective layer on exposed surfaces of the first material layers, etching the blocking layer through the second openings, oxidizing the protective layer, and forming insulating layers in the second openings.

According to an embodiment of the present disclosure, a method of manufacturing a semiconductor device may with forming a stack including alternately stacked first material layers and second material layers, forming a first opening that passes through the stack, forming a sacrificial layer in the first opening, forming a memory layer in the sacrificial layer, forming second openings by selectively removing the second material layers, etching the sacrificial layer through the second openings, selectively forming a protective layer on exposed surfaces of the first material layers, oxidizing the protective layer, etching the memory layer through the second openings, and forming insulating layers in the second openings.

According to an embodiment of the present disclosure, a method of manufacturing a semiconductor device may include forming a stack with alternately stacked first material layers and second material layers, forming a first opening that passes through the stack, forming a memory layer in the first opening, forming a capping insulating layer on the stack, forming a preliminary slit that passes through the capping insulating layer, forming a protective pattern on a surface of the capping insulating layer, forming a slit that is connected to the preliminary slit, passing through the stack, forming second openings by selectively etching the second material layers through the slit, etching the memory layer exposed through the second openings, and forming second insulating layers in the second openings.

According to an embodiment of the present disclosure, a semiconductor device may include a source structure, a stack positioned on the source structure with alternately stacked conductive layers and insulating layers, a channel layer passing through the stack and extending to the source structure, a capping insulating layer on the stack, and a slit structure passing through the capping insulating layer and the stack, and a sidewall of the insulating layers may protrude farther toward the slit structure compared to a sidewall of the capping insulating layer.

BRIEF DESCRIPTION OF THE DRAWINGS

FIGS. 1A to 1D are diagrams illustrating a structure of a semiconductor device according to an embodiment of the present disclosure.

FIGS. 2A to 2M are diagrams illustrating a method of manufacturing a semiconductor device according to an embodiment of the present disclosure.

DETAILED DESCRIPTION

Figure 1B:
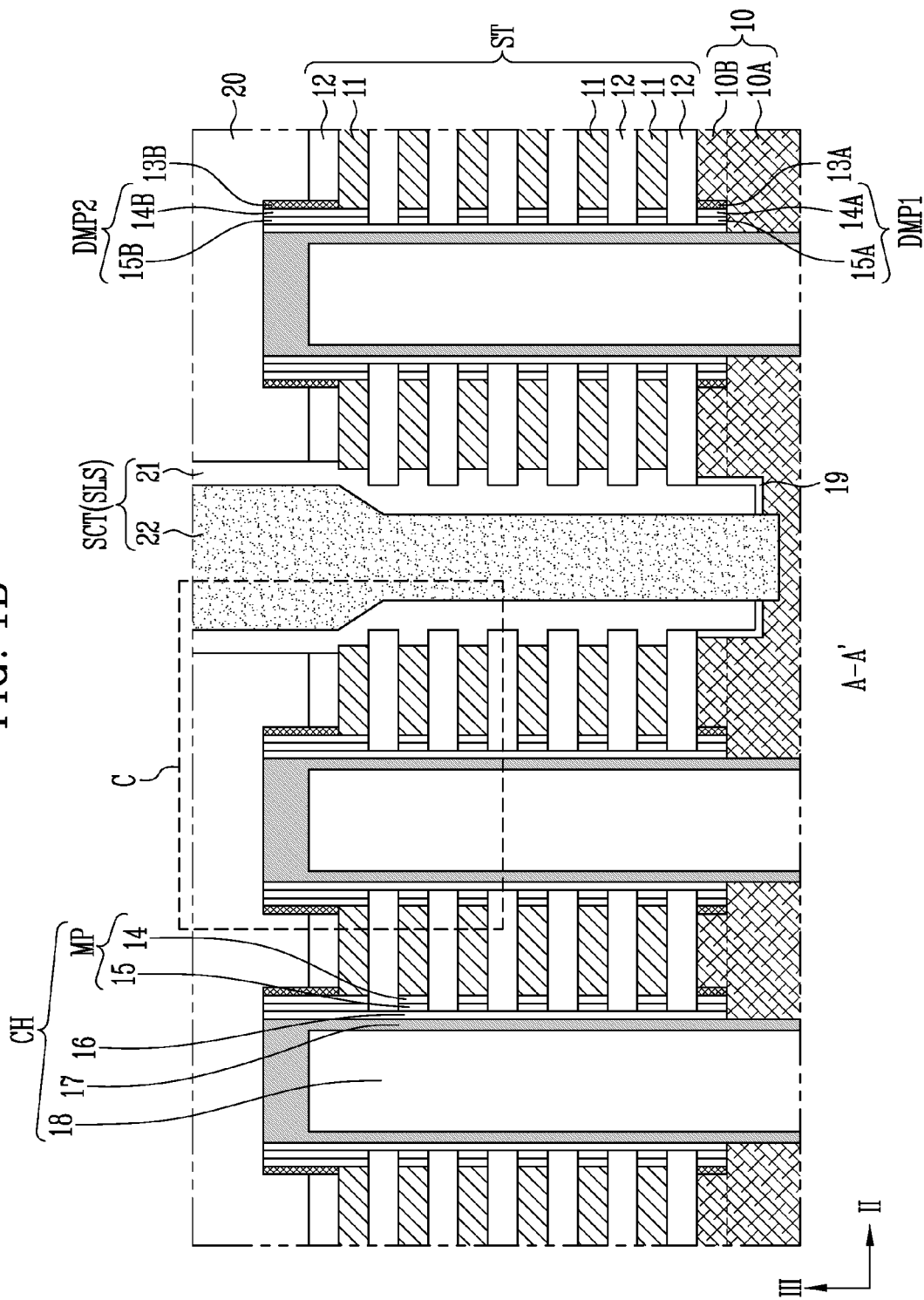

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and are not limited to the embodiments described in the present specification or application.

An embodiment of the present disclosure provides a semiconductor device with a stable structure and an improved characteristic, and a method of manufacturing the semiconductor device.

A degree of integration of a semiconductor device may be improved by stacking memory cells in a three dimension. In addition, a semiconductor device with a stable structure and improved reliability may be provided.

FIGS. 1A to 1D are diagrams illustrating a structure of a semiconductor device according to an embodiment of the present disclosure.

Referring to FIGS. 1A to 1D, the semiconductor device may include a source structure 10, a stack ST, and a channel structure CH. The semiconductor device may further include a protective layer 19, a capping insulating layer 20, a support 23, an isolation insulating structure 24, a contact plug 25, or a slit structure SLS, or may further include a combination thereof.

The source structure 10 may be a single layer or may include multiple layers. As an embodiment, the source structure 10 may include a first source layer 10A and a second source layer 10B. The second source layer 10B may be interposed between the first source layer 10A and the stack ST. The source structure 10 may include a conductive material, such as polysilicon, tungsten, or metal.

The stack ST may be positioned on the source structure 10. The stack ST may include alternately stacked conductive layers 11 and insulating layers 12. The conductive layers 11 may be a gate electrode, such as a memory cell and a selection transistor. The conductive layers 11 may include a conductive material, such as polysilicon, tungsten, molybdenum, or metal. The insulating layers 12 may insulate the stacked conductive layers 11 from each other. The insulating layers 12 may include an insulating material, such as oxide, nitride, and an air gap.

The stack ST may include a cell region CR and a contact region CTR. The cell region CR and the contact region CTR may be adjacent to each other in a first direction I. The cell region CR may be a region in which a memory string is positioned. The contact region CTR may be a region in which an interconnection structure is positioned. The interconnection structure may include a contact plug, a wire, and the like. The memory string may include stacked memory cells and may apply a bias to the gate electrodes of the respective stacked memory cells through the interconnection structure.

The capping insulating layer 20 may be positioned on the stack ST. The capping insulating layer 20 may cover an upper surface of the channel structure CH and an upper surface of the support 23. The capping insulating layer 20 may include an insulating material, such as oxide, nitride, and an air gap. The interconnection structure may be formed in the capping insulating layer 20.

The contact plugs 25 may be positioned in the contact region CTR. As an embodiment, the contact region CTR of the stack ST may have a step shape, and each of the conductive layers 11 may be exposed through the step shape. The contact plugs 25 may pass through the capping insulating layer 20 and may be electrically connected to the conductive layers 11. The contact plugs 25 may be arranged in the first direction I and a second direction II, and the second direction II may cross the first direction I. The second direction II may be perpendicular to the first direction I.

Figure 1C:
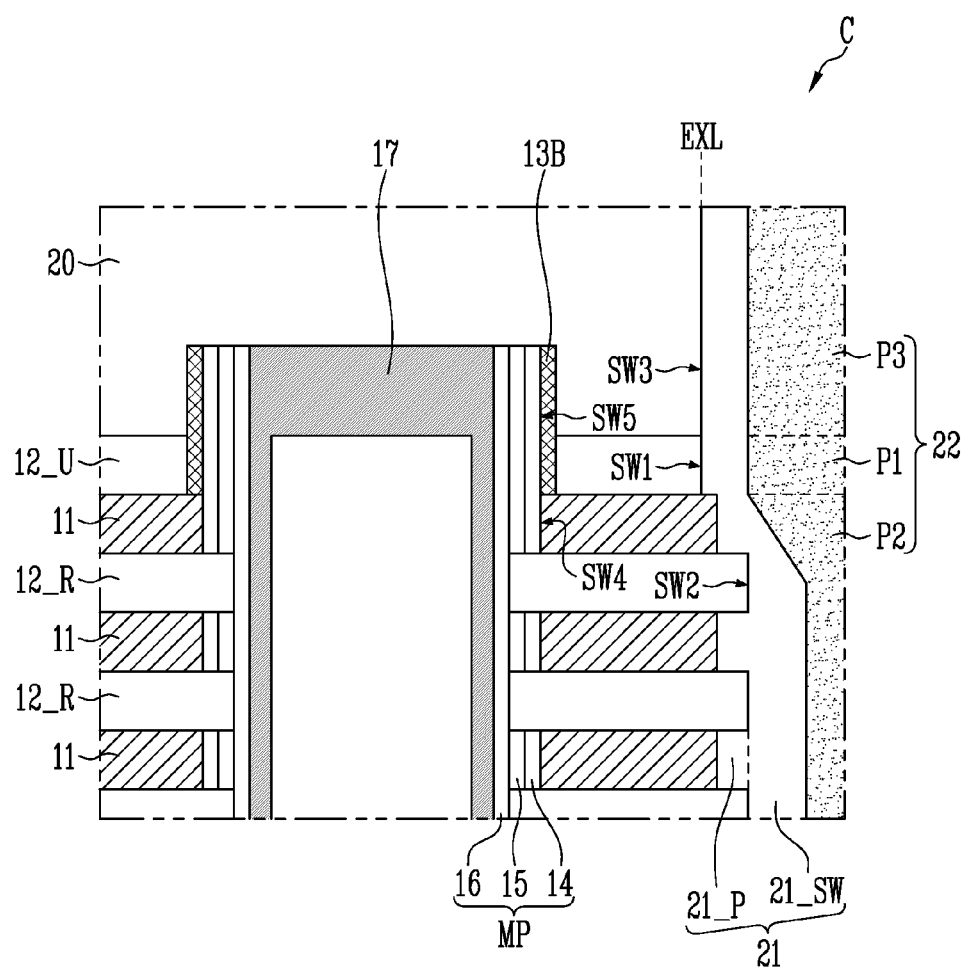
Figure 1D:
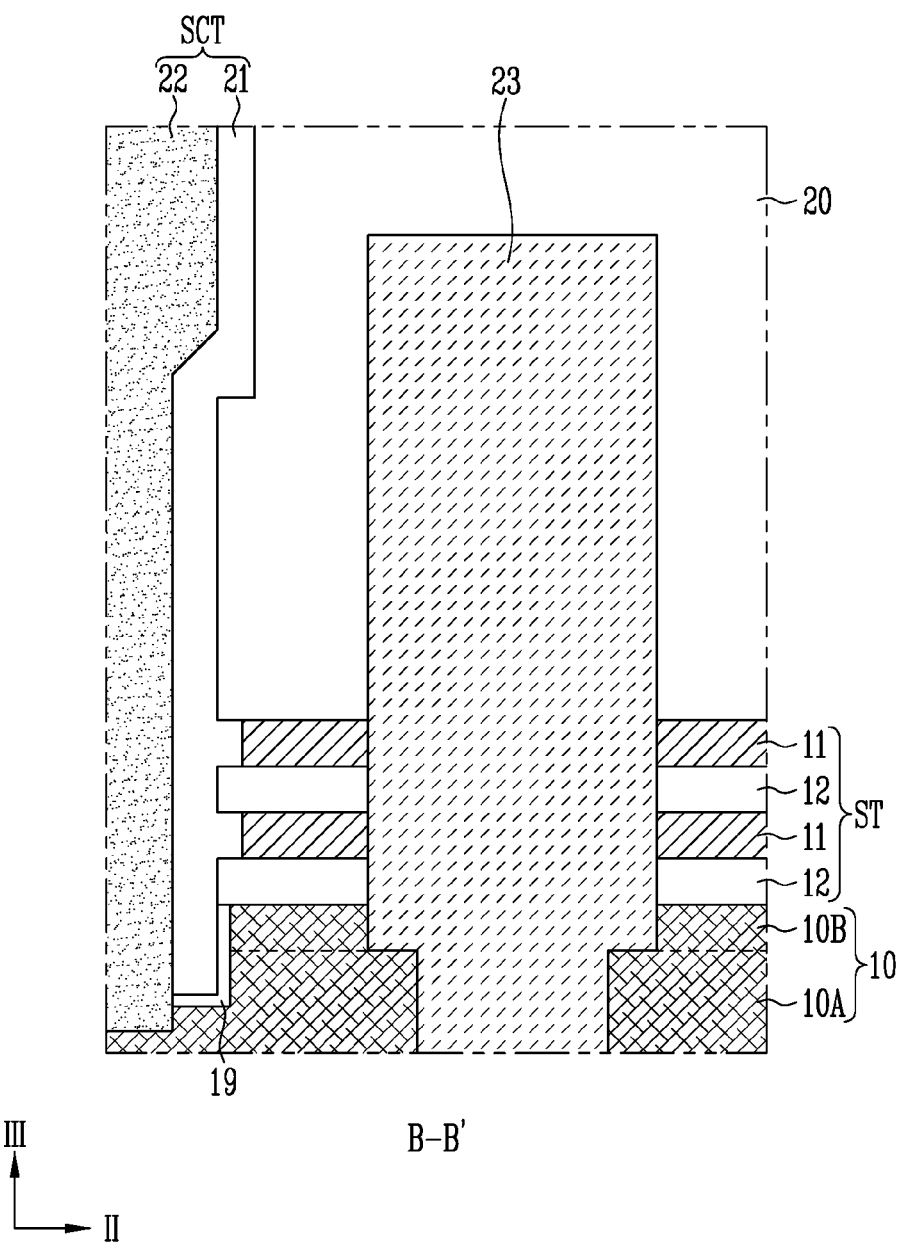

The support 23 may be positioned in the cell region CR or the contact region CTR, or may be positioned in the cell region CR and the contact region CTR. Referring to FIG. 1D, the support 23 may pass through the stack ST and may extend to the capping insulating layer 20. The support 23 may have substantially the same height as the channel structure CH or may have a height that is different than that of the channel structure CH. The support 23 may have substantially the same height as a source contact structure SCT or may have a height that is different than that of the source contact structure SCT. The support 23 may include an insulating material, such as oxide, nitride, and an air gap. The support 23 may have substantially the same structure and material as the channel structure CH or may have substantially the same structure and material as the source contact structure SCT.

The channel structures CH may pass through the cell region CR of the stack ST. The channel structures CH may pass through the stack ST in a third direction III. The third direction III may be a direction crossing the first direction I and the second direction II. The third direction III may be perpendicular to both the first direction I and the second direction II. As an embodiment, the third direction III may be a direction in which the conductive layers 11 and the insulating layers 12 are stacked.

Each of the channel structures CH may include a channel layer 17, memory patterns MP, and an insulating core 18. The channel layer 17 may be a region in which a channel is formed when a memory cell or a select transistor is operated. The channel layer 17 may include a semiconductor material, such as silicon, germanium, or nano structure. The insulating core 18 may be formed in the channel layer 17. The insulating core 18 may include an insulating material, such as oxide, nitride, and an air gap.

Each of the memory patterns MP may be interposed between the channel layer 17 and the conductive layers 11. The memory patterns MP may be separated from each other by the insulating layers 12. Each of the memory patterns MP may include a tunnel insulating pattern, a data storage pattern 15, or a blocking pattern 14, or may include a combination thereof. The data storage pattern 15 may include a floating gate, a charge trap material, polysilicon, nitride, a variable resistance material, a phase change material, or may include a combination thereof.

The channel structure CH may further include a first dummy memory pattern DMP1, a second dummy memory pattern DMP2, a first sacrificial pattern 13A, or a second sacrificial pattern 13B, or may further include a combination thereof.

The first dummy memory pattern DMP1 may be interposed between the channel layer 17 and the source structure 10. As an embodiment, the first dummy memory pattern DMP1 may be interposed between the channel layer 17 and the second source layer 10B, and the first dummy memory pattern DMP1 may contact the first source layer 10A. The first dummy memory pattern DMP1 may include a dummy tunnel insulating pattern, a dummy data storage pattern 15A, or a dummy blocking pattern 14A, or may include a combination thereof. The dummy tunnel insulating pattern may include substantially the same material as the tunnel insulating pattern. The dummy data storage pattern 15A may include substantially the same material as the data storage pattern 15. The dummy blocking pattern 14A may include substantially the same material as the blocking pattern 14.

The first sacrificial pattern 13A may be formed to surround a sidewall of the first dummy memory pattern DMP1. The first sacrificial pattern 13A may be interposed between the first dummy memory pattern DMP1 and the source structure 10. As an embodiment, the first sacrificial pattern 13A may be interposed between the first dummy memory pattern DMP1 and the second source layer 10B, and the first sacrificial pattern 13A may contact the first source layer 10A.

The second dummy memory pattern DMP2 may be interposed between the channel layer 17 and the capping insulating layer 20, and the second dummy memory pattern DMP2 may extend between the channel layer 17 and an uppermost insulating layer 12. The second dummy memory pattern DMP2 may be connected to an uppermost memory pattern. As an embodiment, the second dummy memory pattern DMP2 may include a dummy tunnel insulating pattern, a dummy data storage pattern 15B, or a dummy blocking pattern 14B, or may include a combination thereof. The dummy tunnel insulating pattern may include substantially the same material as the tunnel insulating pattern. The dummy data storage pattern 15B may include substantially the same material as the data storage pattern 15. The dummy blocking pattern 14B may include substantially the same material as the blocking pattern 14.

The second sacrificial pattern 13B may be formed to surround a sidewall of the second dummy memory pattern DMP2. The second sacrificial pattern 13B may be interposed between the second dummy memory pattern DMP2 and the capping insulating layer 20, and the second sacrificial pattern 13B may extend between the second dummy memory pattern DMP2 and the uppermost insulating layer 12.

As an embodiment, the channel structure CH may include memory patterns MP, the first dummy memory pattern DMP1, and the second dummy memory pattern DMP2. Each of the memory patterns MP may include the data storage pattern 15 and the blocking pattern 14, the first dummy memory pattern DMP1 may include the dummy data storage pattern 15A and the dummy blocking pattern 14A, and the second dummy memory pattern DMP2 may include the dummy data storage pattern 15B and the dummy blocking pattern 14B.

In addition, the channel structure CH may additionally include a memory layer. As an embodiment, the channel structure CH may further include a tunnel insulating layer 16. The tunnel insulating layer 16 may be formed to surround a sidewall of the channel layer 17. The tunnel insulating layer 16 may be interposed between the channel layer 17 and the data storage patterns 15 and interposed between the channel layer 17 and the insulating layers 12, may extend between the channel layer 17 and the first dummy memory pattern DMP1, and may contact the first source layer 10A. The tunnel insulating layer 16 may extend between the channel layer 17 and the second dummy memory pattern DMP2, and the tunnel insulating layer 16 may contact the capping insulating layer 20.

The isolation insulating structure 24 may pass through the stack ST between the channel structures CH. The isolation insulating structure 24 may be positioned in the cell region CR and may extend in the first direction I. The isolation insulating structure 24 may extend to the contact region CTR. The isolation insulating structure 24 may pass through the stack ST at a depth that is shallower than that of the slit structure SLS. As an embodiment, the isolation insulating structure 24 may have a depth that passes through at least one uppermost conductive layer 11.

The slit structure SLS may pass through the stack ST between the channel structures CH. As an embodiment, the slit structure SLS may be the source contact structure SCT. The source contact structure SCT may pass through the stack ST between the channel structures CH. The source contact structure SCT may cross the cell region CR and the contact region CTR, and the source contact structure SCT may extend in the first direction I. The source contact structure SCT may include a source contact 22 and an insulating spacer 21.

The source contact 22 may pass through the capping insulating layer 20 and the stack ST, and the source contact 22 may extend into the source structure 10. The source contact 22 may be a single layer or may include multiple layers. The source contact 22 may be electrically connected to the source structure 10. The source contact 22 may include a conductive material, such as polysilicon, tungsten, molybdenum, or metal. The source contact 22 may have a different width based on the level at which it is measured. Referring to FIG. 1C, the source contact 22 may include a first portion P1 that corresponds to an uppermost insulating layer 12_U and a second portion P2 that is positioned under the first portion P1. The first portion P1 may have a width that is wider than that of the second portion P2. The source contact 22 may further include a third portion P3 that corresponds to the capping insulating layer 20. The third portion P3 may have a width that is wider than that of the second portion P2. The third portion P3 may have substantially the same width as the first portion P1 or may have a width that is different than that of the first portion P1.

The insulating spacer 21 may insulate the source contact 22 and the conductive layers 11 from each other. The insulating spacer 21 may include an insulating material, such as oxide, nitride, and an air gap. Referring to FIG. 1C, the insulating spacer 21 may include a sidewall portion 21_SW that surrounds a sidewall of the source contact 22 and protrusions 21_P that protrude from the sidewall portion 21_SW. The protrusions 21_P may be positioned to correspond to the conductive layers 11, and the protrusions 21_P may protrude toward the conductive layers 11.

The protective layer 19 may be interposed between the insulating spacer 21 and the source structure 10. The protective layer 19 may include an insulating material, such as oxide, nitride, and an air gap.

Referring to FIG. 1C, the insulating layers 12 may have a sidewall that faces the source contact structure SCT. Among the insulating layers 12, the uppermost insulating layer 12_U may have a first sidewall SW1. Among the insulating layers 12, the remaining insulating layers 12_R may have second sidewalls SW2. The capping insulating layer 20 may have a third sidewall SW3. The second sidewalls SW2 may protrude farther toward the source contact structure SCT compared to the first sidewall SW1. The first sidewall SW1 may be aligned with the third sidewall SW3. The first side wall SW1 may be positioned on an extension line EXL of the third side wall SW3.

The conductive layers 11 may have fourth sidewalls SW4 that face the channel layer 17. The second sacrificial pattern 13B may have a fifth sidewall SW5 that face the channel layer 17. The fourth sidewalls SW4 may be aligned with the fifth sidewall SW5.

According to the structure as described above, the memory cell or the select transistor may be positioned in a region in which the channel structure CH and the conductive layers 11 cross. Therefore, the memory string may include memory cells that are stacked in the third direction III, thereby improving the degree of integration of the semiconductor device. In addition, the memory patterns MP of the stacked memory cells may be separated from each other, and the memory patterns MP may have a uniform shape. Therefore, data retention characteristics may be improved, and memory cells may be more uniform.

FIGS. 2A to 2M are diagrams illustrating a method of manufacturing a semiconductor device according to an embodiment of the present disclosure. Hereinafter, contents repetitive to the previously described contents are omitted.

Figure 2A:
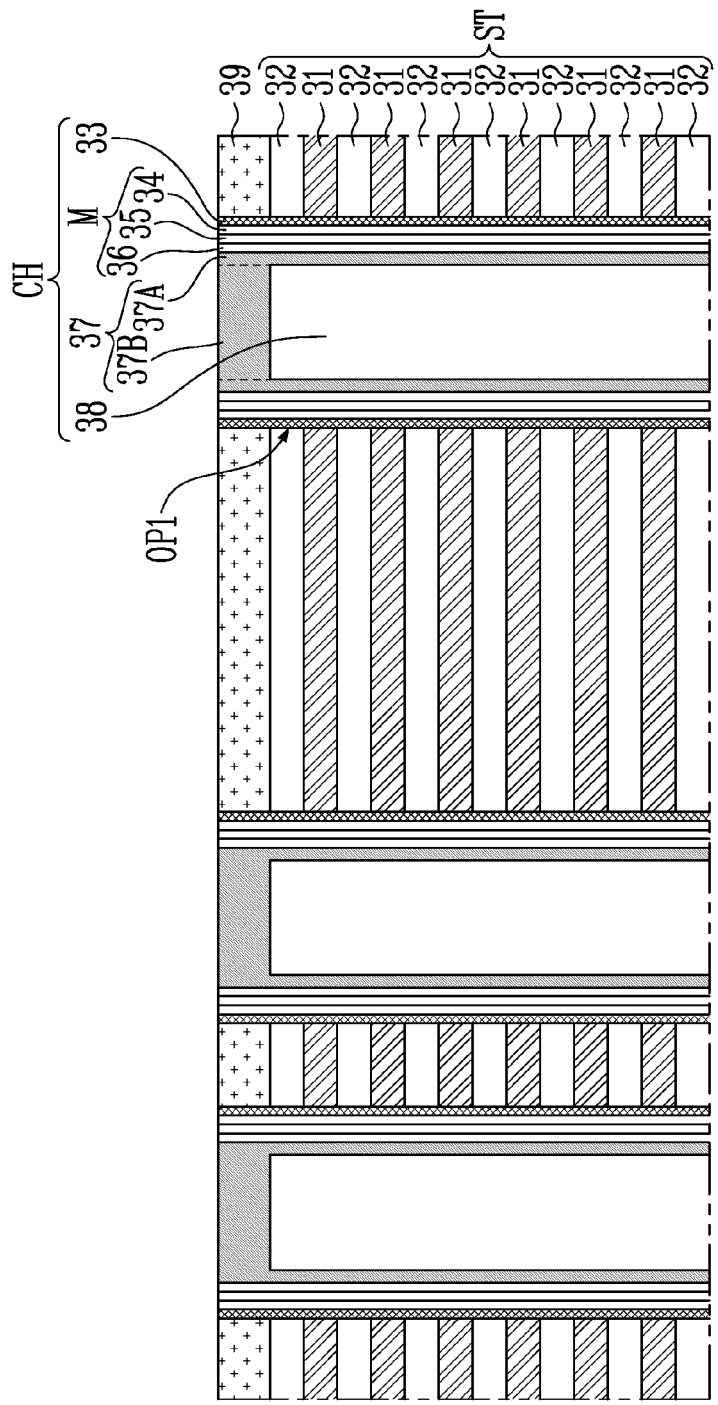

Referring to FIG. 2A, the stack ST may be formed on a base (not shown) with a lower structure, such as a source structure. The stack ST may include alternately stacked first material layers 31 and second material layers 32. The first material layers 31 may form the gate electrode, such as the memory cell or the select transistor. The first material layers 31 may include a material with a high etching selectivity with respect to the second material layers 32. For example, the first material layers 31 may include a sacrificial material, such as nitride, and the second material layers 32 may include an insulating material, such as oxide. As another example, the first material layers 31 may include a conductive material, such as polysilicon, tungsten, and molybdenum, and the second material layers 32 may include an insulating material, such as oxide.

Subsequently, a hard mask pattern 39 may be formed on the stack ST. The hard mask pattern 39 may include nitride, carbon, or the like. Subsequently, a first opening OP1 passing through the stack ST may be formed. As an embodiment, the first openings OP1 may be formed by etching the stack ST by using the hard mask pattern 39 as an etching barrier. Each of the first openings OP1 may have a plane, such as a circle, an ellipse, and a polygon.

Subsequently, the channel structure CH may be formed in the first opening OP1. The channel structure CH may include a memory layer M, a channel layer 37, or an insulating core 38, or may include a combination thereof. As an embodiment, a blocking layer 34, a data storage layer 35, or a tunnel insulating layer 36 may be formed in the first opening OP1, or a combination thereof may be formed in the first opening OP1. Subsequently, a channel layer 37A may be formed, and the insulating core 38 may be formed in the channel layer 37A. Subsequently, the insulating core 38 may be partially etched, and then a capping conductive layer 37B may be formed. Subsequently, a planarization process may be performed until the hard mask pattern 39 is exposed. The planarization process may use a chemical mechanical polishing (CMP) process. As a result, the channel structure CH may be formed.

For reference, before forming the memory layer M, a sacrificial layer 33 may be formed in the first opening OP1. The sacrificial layer 33 may protect the memory layer M in a subsequent process and may include a material with a high etching selectivity with respect to the first material layers 31 and the second material layers 32. As an embodiment, the first material layers 31 may include nitride, the second material layers 32 may include oxide, and the sacrificial layer 33 may include polysilicon.

Figure 2B:
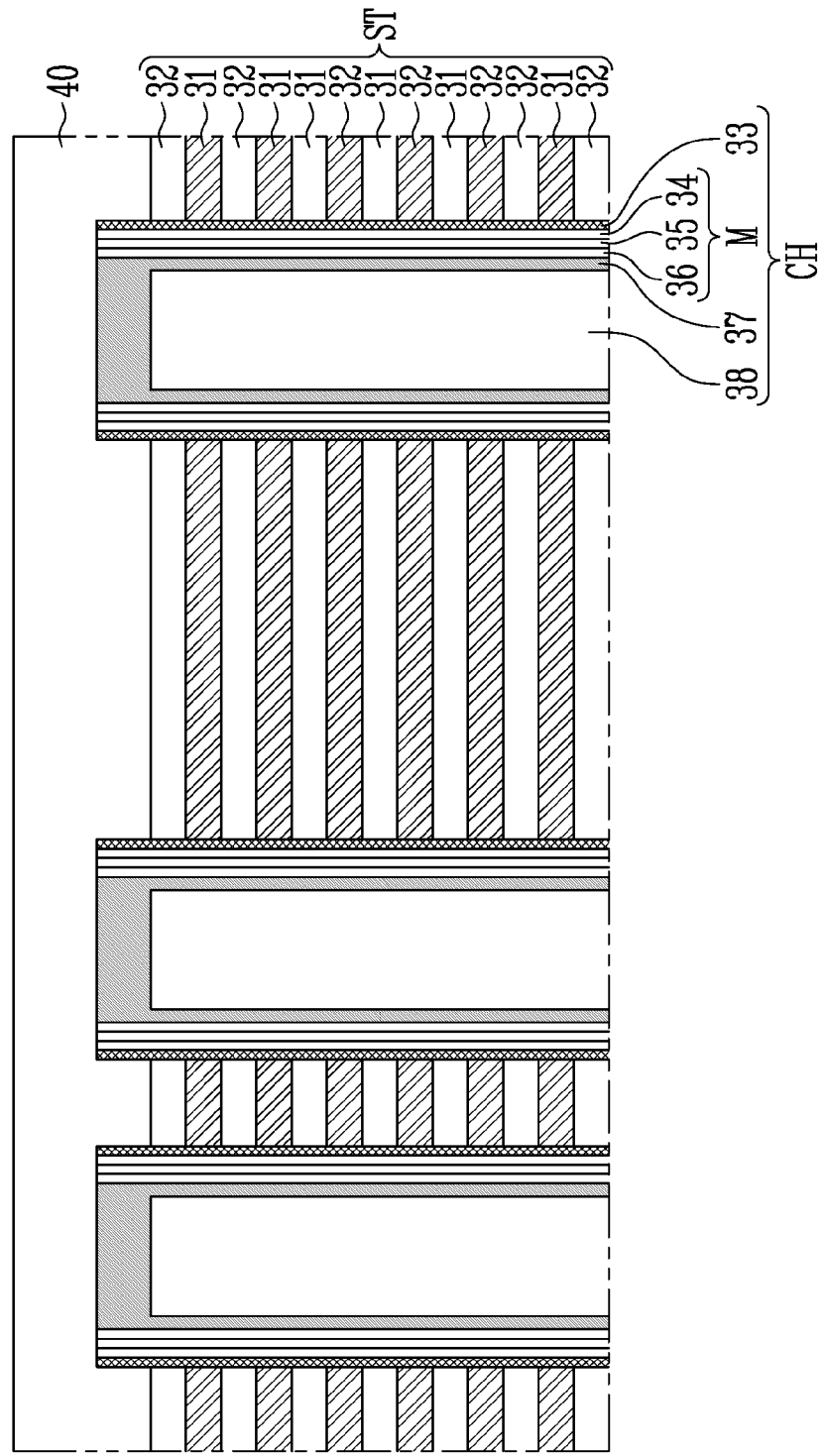

Referring to FIG. 2B, the hard mask pattern 39 may be removed. As a result, the channel structure CH may protrude from an upper surface of the stack ST. Subsequently, a capping insulating layer may be formed. The capping insulating layer 40 may include an insulating material, such as oxide, nitride, and an air gap. For reference, the capping insulating layer 40 may be a single layer or may include multiple layers. In addition, although not shown in the present drawing, the contact region of the stack ST may be patterned in a step shape.

Figure 2C:
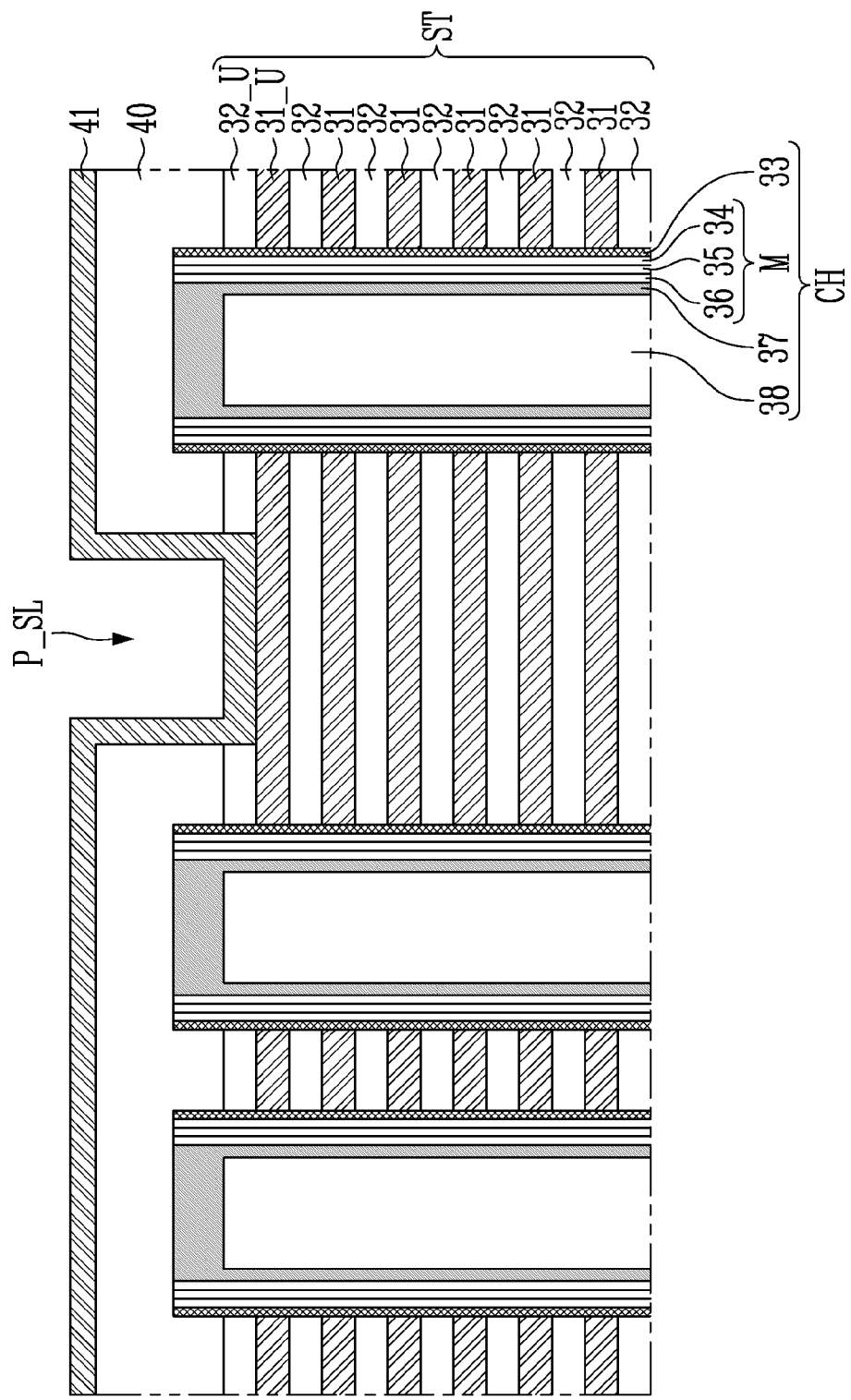

Referring to FIGS. 2C and 2D, the slit SL passing through the capping insulating layer 40 and the stack ST is formed. As an embodiment, the slit SL may expose the source structure positioned under the stack ST.

First, referring to FIG. 2C, a preliminary slit P_SL that passes through the capping insulating layer 40 may be formed. Subsequently, a protective pattern 41 may be formed on a surface of the capping insulating layer 40. The protective pattern 41 may protect the capping insulating layer 40 in a subsequent process. The protective pattern 41 may be conformally formed along an inner surface of the preliminary slit P_SL and an upper surface of the capping insulating layer 40. The protective pattern 41 may include a material with a high etching selectivity with respect to the second material layers 32. As an embodiment, the second material layers 32 may include oxide and the protective pattern 41 may include nitride or polysilicon.

For reference, the preliminary slit P_SL may pass through the capping insulating layer 40 and an uppermost second material layer 32_U, and the preliminary slit P_SL may expose an uppermost first material layer 31_U. In this case, the protective pattern 41 may be formed along a surface of the capping insulating layer 40 and a surface of the uppermost second material layer 32_U. The protective pattern 41 may protect the capping insulating layer 40 and the uppermost second material layer 32_U in a subsequent process.

Subsequently, referring to FIG. 2D, the preliminary slit P_SL may be extended into the stack ST to form the slit SL. The slit SL may pass through the capping insulating layer 40 and the stack ST. As an embodiment, after forming a gap-fill layer in the preliminary slit P_SL, the gap-fill layer, the protective pattern 41, and the stack ST may be etched by using the mask pattern as an etching barrier to form the slit SL.

Figure 2E:
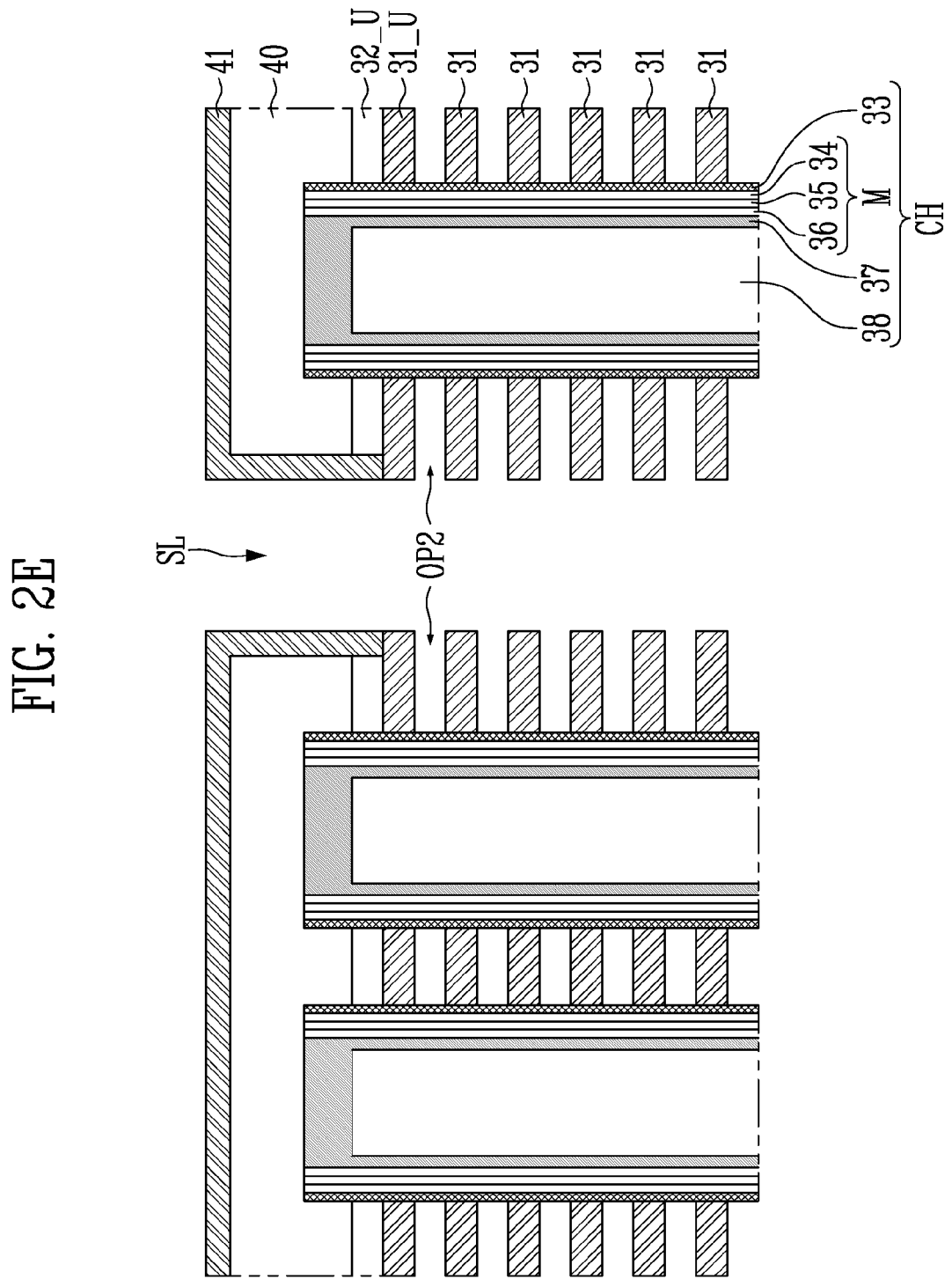

Referring to FIG. 2E, second openings OP2 may be formed. The second openings OP2 may be formed by selectively removing the second material layers 32 through the slit SL. As an embodiment, the second material layers 32 may be selectively etched by using a deep-out process. When the second openings OP2 are formed, the capping insulating layer 30 may be protected by the protective pattern 41. When the second openings OP2 are formed, the uppermost second material layer 32_U may be protected by the protective pattern 41 and the uppermost first material layer 31_U. When the second openings OP2 are formed, the memory layer M may be protected by the sacrificial layer 33.

Figure 2F:
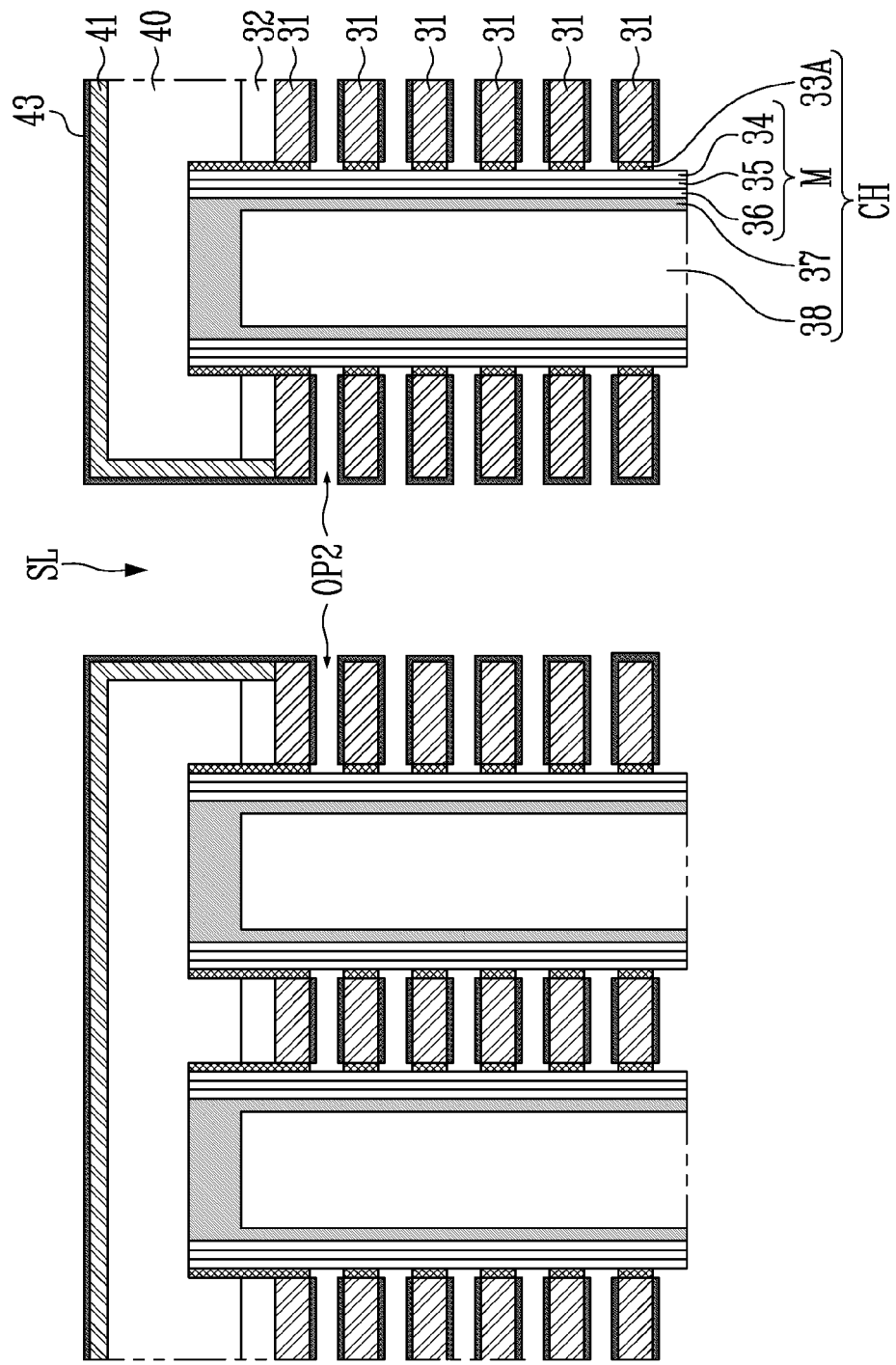

Referring to FIG. 2F, the sacrificial layer 33 exposed through the second openings OP2 is etched, thereby forming sacrificial patterns 33A. The sacrificial patterns 33A may be interposed between the first material layers 31 and the channel layer 37, respectively.

Subsequently, protective layers 43 are formed. The protective layers 43 may be formed along a surface of the first material layers 31 that is exposed through the second openings OP2. As an embodiment, the protective pattern 41 and the first material layers 31 may include the same material, and the protective layer 43 may be formed along a surface of the protective pattern 41 as well. For instance, when the first material layers 31 and the protective pattern 41 are nitride layers, the protective layers 43 may be formed by selectively depositing silicon on the surface of the nitride layers. The protective layers 43 may include polysilicon. However, the present disclosure is not limited thereto, and the protective pattern and the first material layers may include different materials.

Figure 2G:
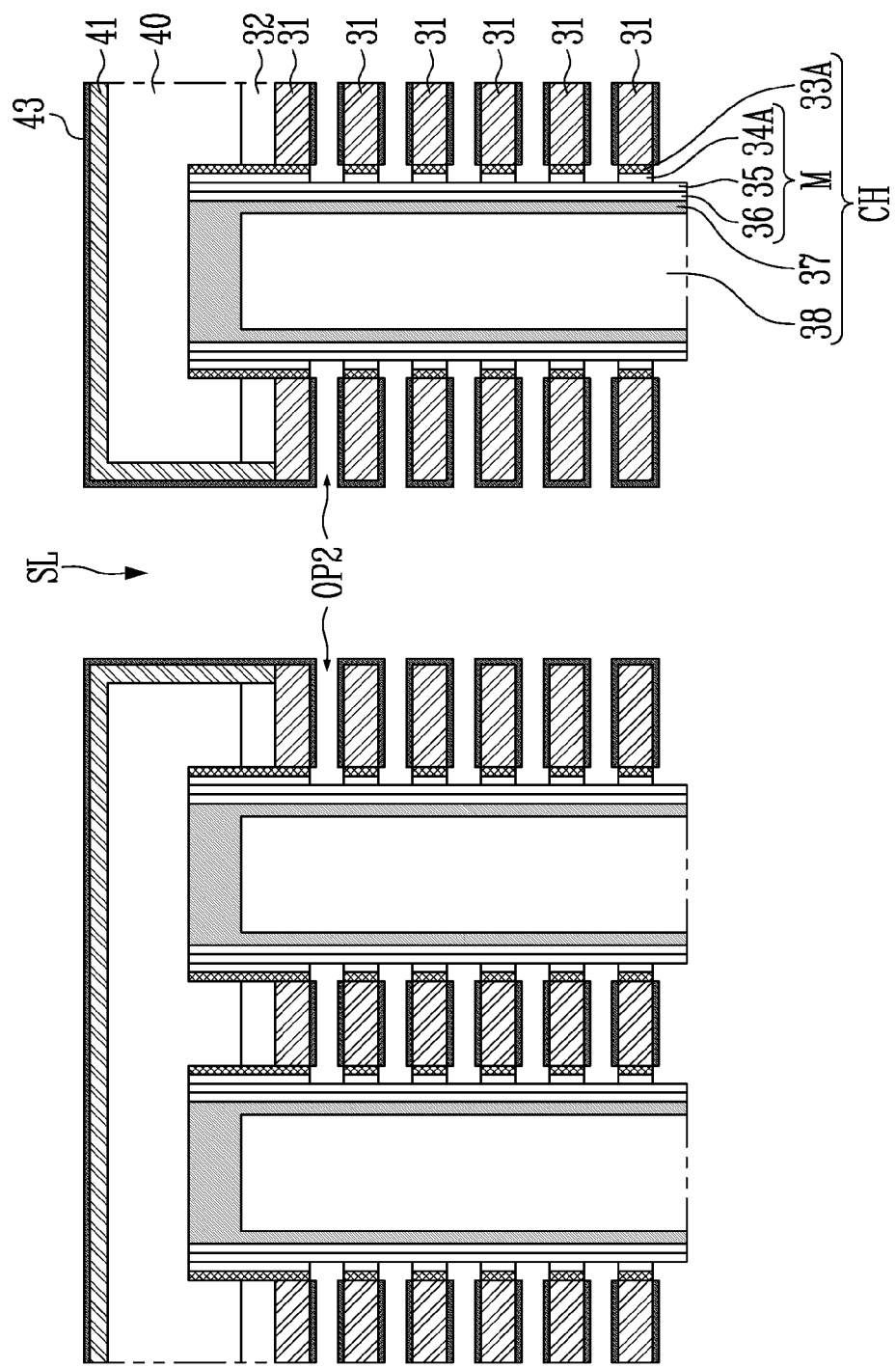

Referring to FIG. 2G, the blocking layer 34 may be selectively etched through the second openings OP2, thereby forming blocking patterns 34A. The data storage layer 35 may be exposed in the second openings OP2. The blocking patterns 34A may be interposed between the channel layer 37 and the first material layers 31, respectively.

Figure 2H:
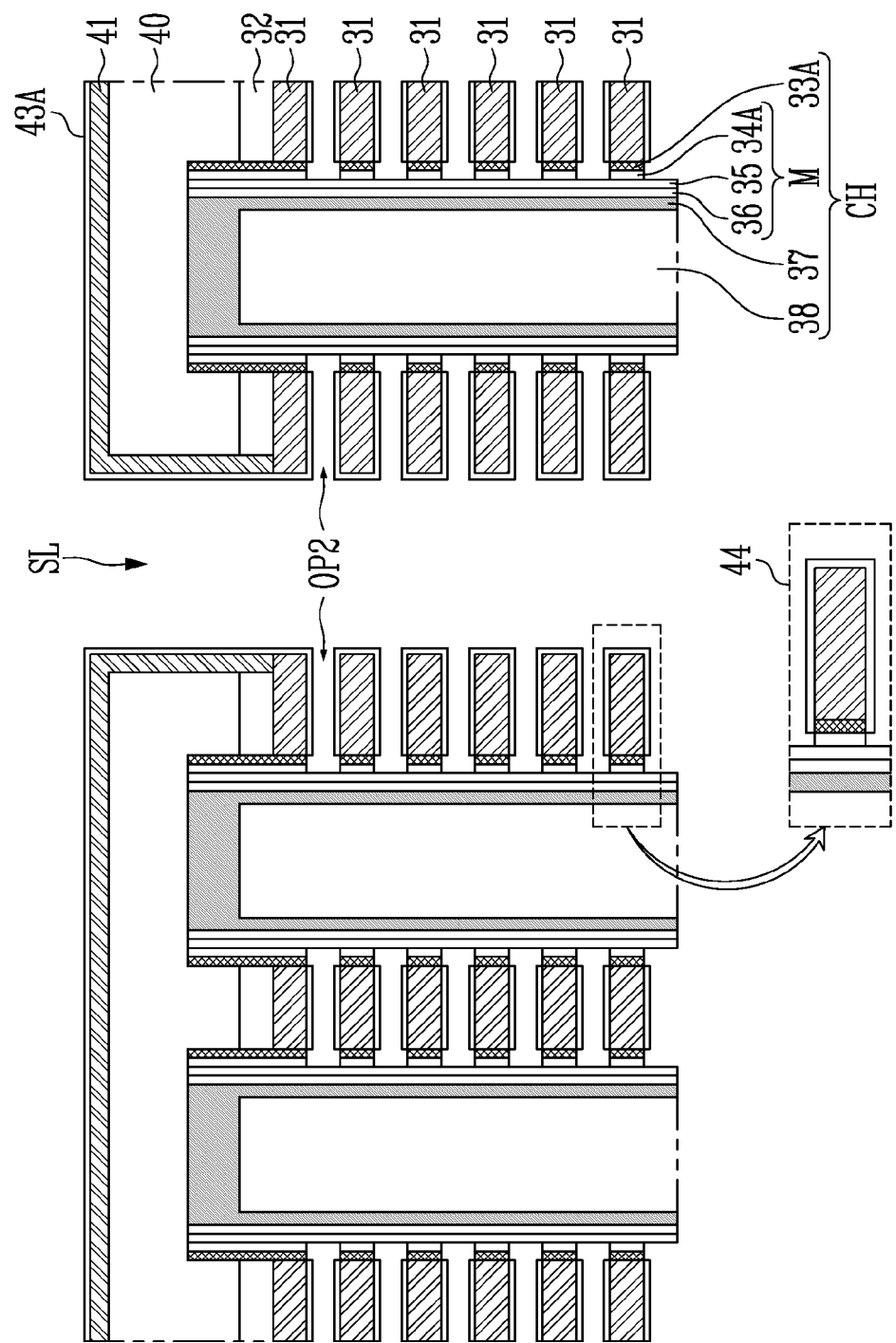

Referring to FIG. 2H, the protective layers 43 may be selectively oxidized, thereby forming oxidized protective layers 43A. The oxidized protective layers 43A may be formed on the surface of the first material layers 31 and the surface of the protective pattern 41. In another embodiment, when the protective layers 43 are selectively oxidized and the protective layers 43 and the sacrificial patterns 33A are formed of the same material, the surface of the sacrificial patterns 33A that are exposed through the second openings OP2 may be oxidized as well. This particular embodiment is illustrated in portion 44 of FIG. 2H. In this case, the oxidized protective layers 43A may cover the sacrificial patterns 33A.

Figure 2I:
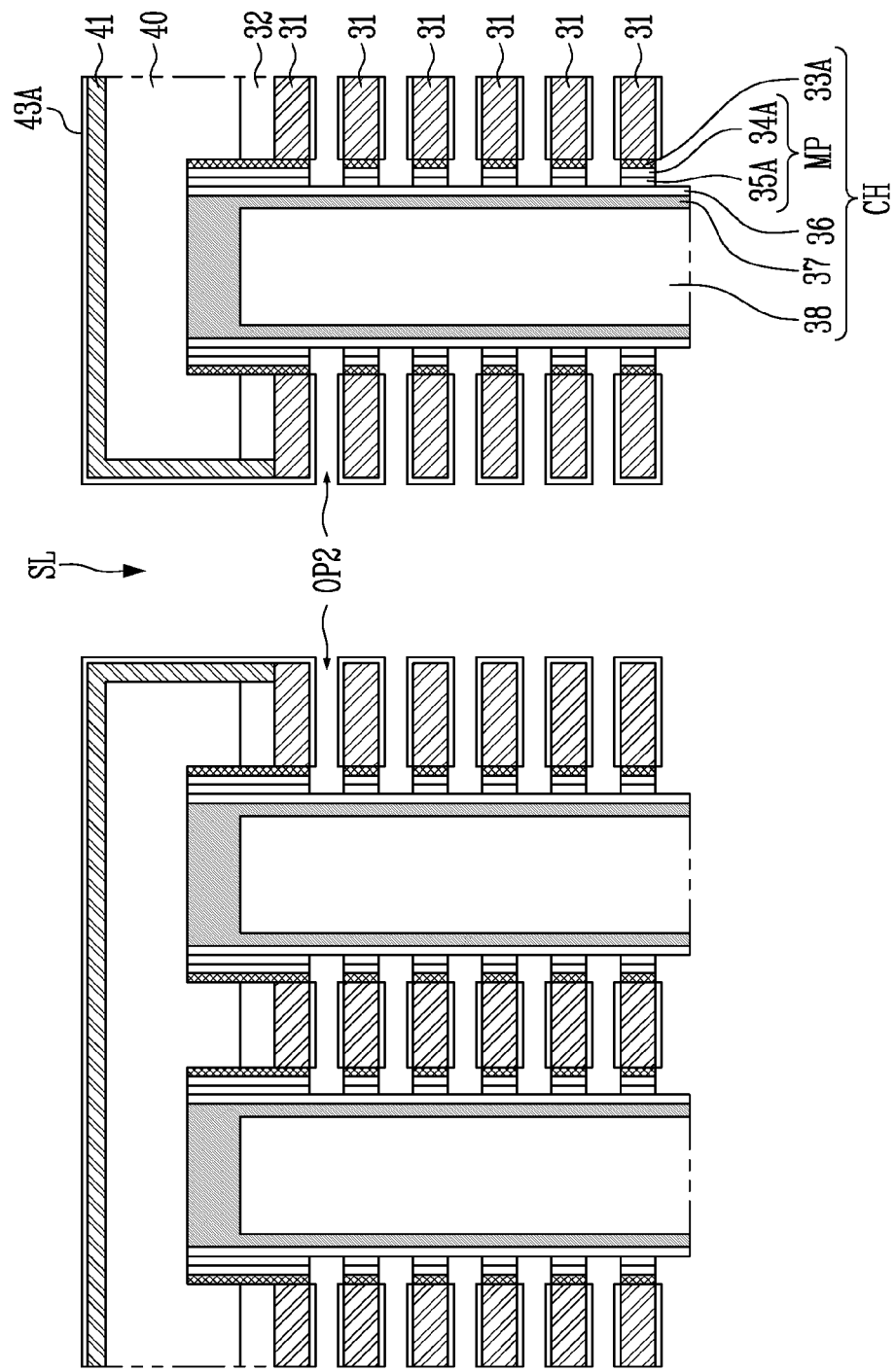

Referring to FIG. 2I, the data storage layer 35 may be selectively etched through the second openings OP2, thereby forming data storage patterns 35A. The tunnel insulating layer 36 may be exposed in the second openings OP2. The data storage patterns 35A may be interposed between the channel layer 37 and the first material layers 31, respectively. When the data storage layer 35 is selectively etched, the first material layers 31 may be protected by the oxidized protective layers 43A.

Therefore, the memory patterns MP that are separated from each other are formed. Each of the memory patterns MP may include the data storage pattern 35A and the blocking pattern 34A. For reference, tunnel insulating patterns may also be formed by etching the tunnel insulating layer 36 through the second openings OP2.

Meanwhile, forming and oxidizing the protective layers 43 may be omitted. In this particular embodiment, after forming the second openings OP2, the sacrificial layer 33, the blocking layer 34, and the data storage layer 35 are sequentially etched. In this case, when the data storage layer 35 is etched, the first material layers 31 may be partially etched. Therefore, when the first material layers 31 and the second material layers 32 are alternately formed, the first material layers 31 are formed at a sufficient thickness in consideration of the etching amount of the first material layers 31.

Figure 2J:
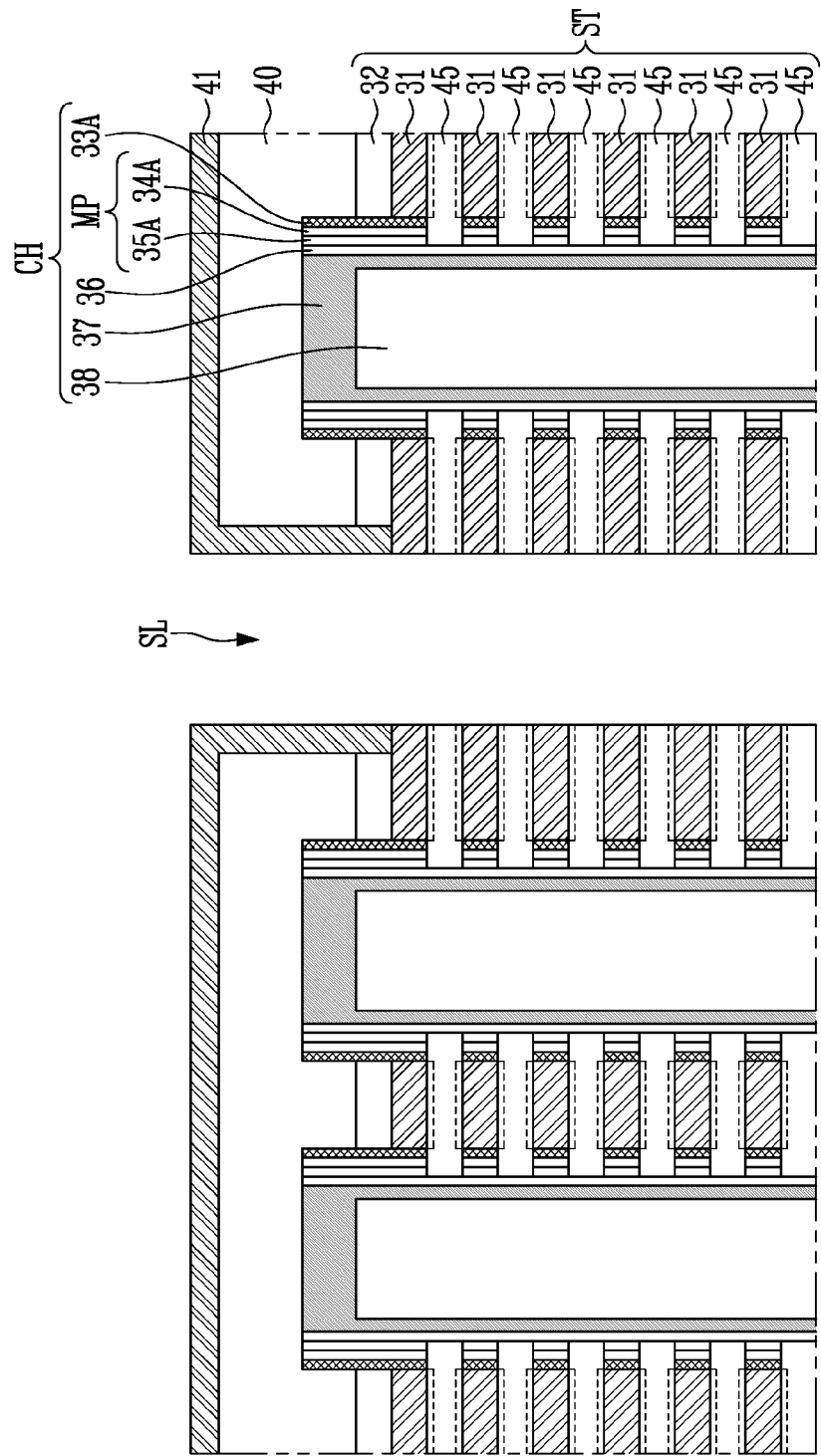

Referring to FIG. 2J, insulating layers 45 may be formed in the second openings OP2, respectively. As an embodiment, an insulating material may be deposited along the inner surfaces of the second openings OP2 and the slit SL. As a result, the inside of the second openings OP2 and a portion of the slit SL may be filled with the insulating material. Subsequently, a portion of the insulating material that is formed in the slit SL may be etched to form the insulating layers 45. The insulating material may be etched by using a wet cleaning process.

When the insulating material is etched, some of the oxidized protective layers 43A may be etched together. The portion of the oxidized protective layers 43A that is exposed in the slit SL may be etched, and thus, the first material layers 31 may be exposed. The oxidized protective layer 43 that is formed on the surface of the protective pattern 41 may be etched, and the protective pattern 41 may be exposed.

For reference, a wet cleaning process may also be performed after repeatedly performing a process of depositing the insulating material and a process of etching the insulating material. A seam may be prevented from being formed in the second openings OP2 by repeatedly performing the deposition process and the etching process.

Referring to FIG. 2K, third openings OP3 may be formed by removing the first material layers 31. The third openings OP3 may be formed by selectively etching the first material layers 31 through the slit SL. The first material layers 31 may be selectively etched by using a wet cleaning process. As a result, the sacrificial patterns 33A may be exposed in the third openings OP3. When the third openings OP3 are formed, the blocking patterns 34A may be protected by the sacrificial patterns 33A. Subsequently, the sacrificial patterns 33A may be selectively etched through the third openings OP3. As a result, the blocking patterns 34A may be exposed in the third openings OP3.

For reference, when the first material layers 31 are removed, the protective pattern 41 may be removed together. In this case, the width of the slit SL may be expanded by a width of the protective pattern 41.

Figure 2L:
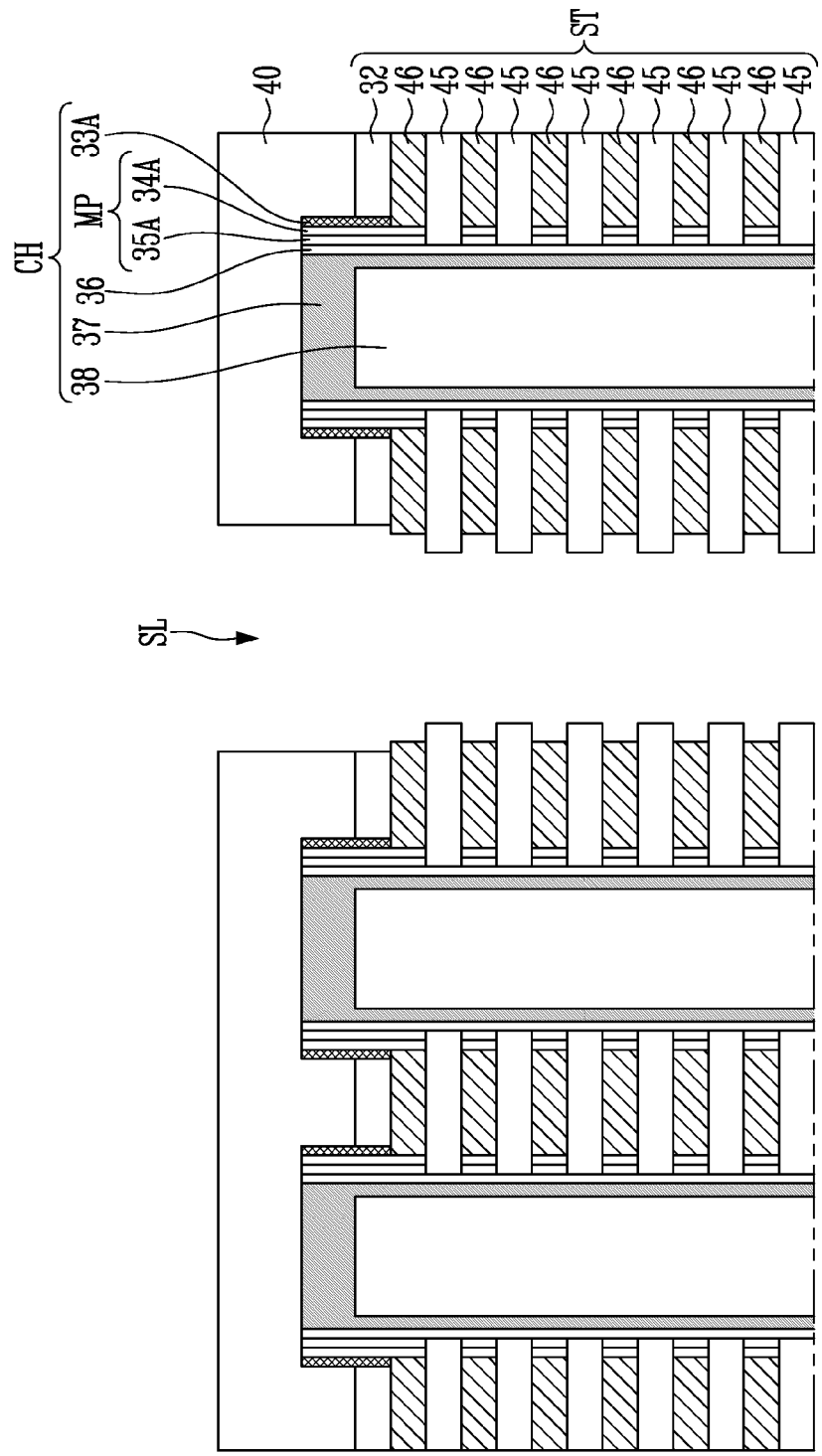

Referring to FIG. 2L, conductive layers 46 may be formed in the third openings OP3. The conductive layers 46 may include a conductive material, such as polysilicon, tungsten, molybdenum, or metal. In an embodiment, a conductive material may be deposited along an inner surface of the third openings OP3 and the slit SL. As a result, an inside of the third openings OP3 and a portion of the slit SL may be filled with the conductive material. Subsequently, a portion of the conductive material that is formed in the slit SL may be etched to form the conductive layers 46.

For reference, the conductive layers 46 may also be formed without removing the sacrificial patterns 33A. Alternatively, the first material layers 31 may become silicide without removing the first material layers 31.

Figure 2M:
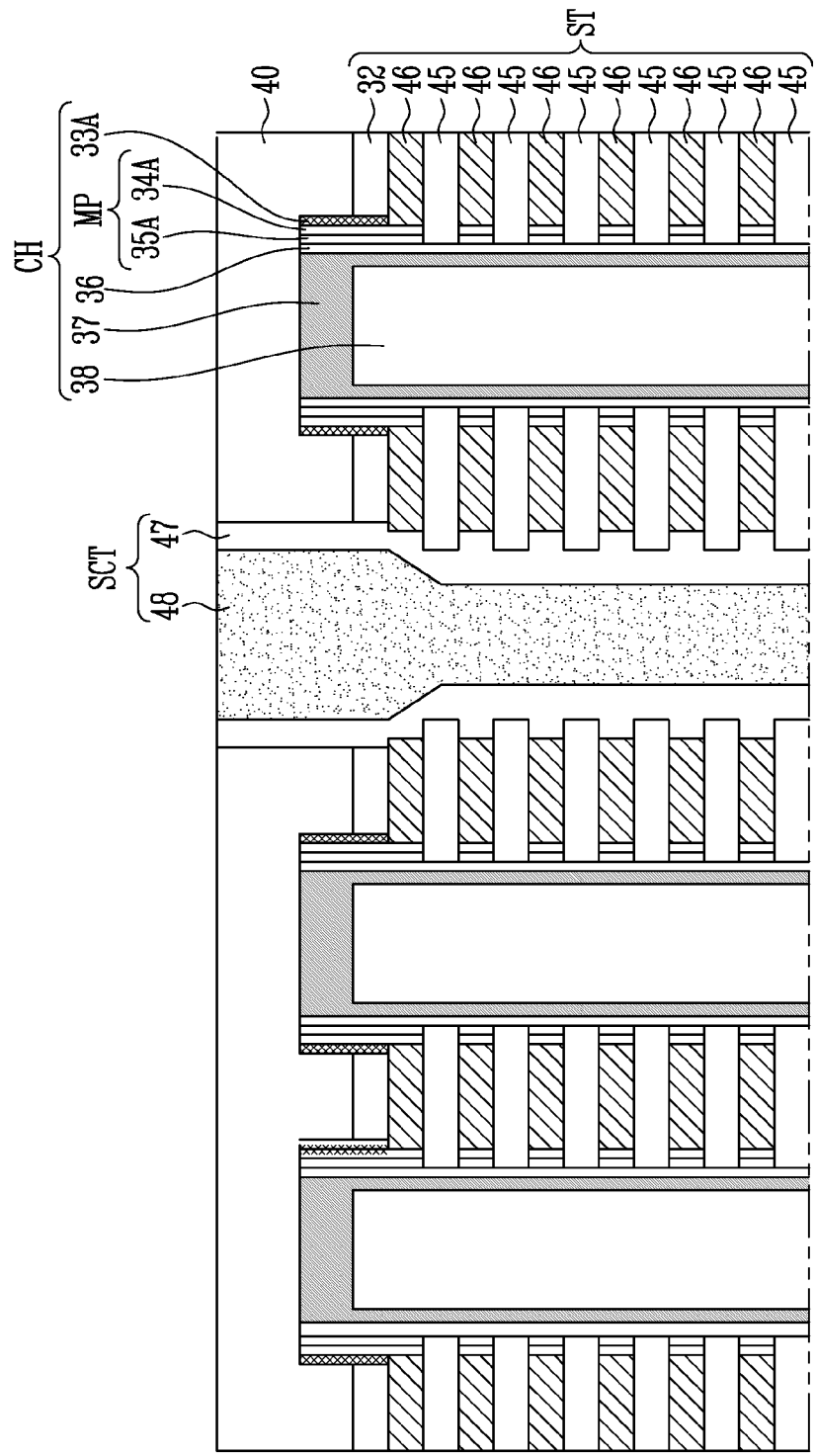

Referring to FIG. 2M, the source contact structure SCT may be formed in the slit SL. As an embodiment, after forming an insulating spacer 47 on an inner wall of the slit SL, a source contact 48 may be formed.

According to the above-described manufacturing method, the memory layer M may be formed in the first opening OP1, and the memory layer M may be etched through the second openings OP2. Therefore, a portion of the memory layer M that is formed in a space region between the memory cells may be etched, and as a result, the memory patterns MP that are separated from each other may be formed. Since only the blocking layer 34 and the data storage layer 35 are etched through the second openings OP2, the shape of the tunnel insulating layer 36 and the channel layer 37 may be maintained. In addition, interfaces between the blocking pattern 34A, the data storage pattern 35A, the tunnel insulating layer 36, and the channel layer 37 may maintain the shape and characteristic at the time of deposition. As an embodiment, roughness of the interfaces may be maintained.

FIGS. 3A to 3G are diagrams illustrating a method of manufacturing a semiconductor device according to an embodiment of the present disclosure. Hereinafter, contents repetitive to the previously described contents are omitted.

Figure 3A:
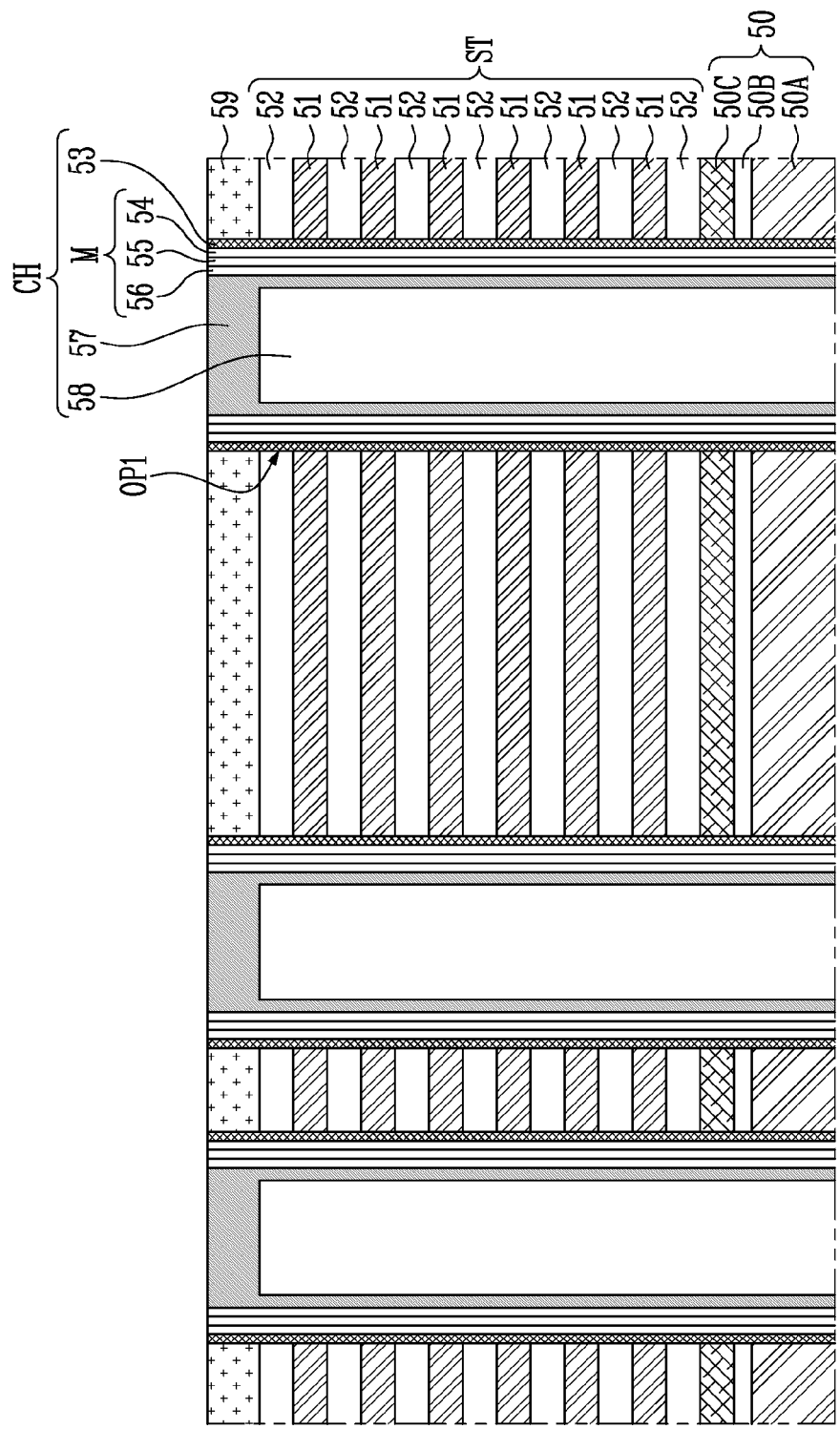
FIGS. 3A to 3G are diagrams illustrating a method of manufacturing a semiconductor device according to an embodiment of the present disclosure.

Referring to FIG. 3A, a source structure 50 may be formed. The source structure 50 may include a source layer or a sacrificial layer, or both. The source layer may include a conductive material, such as polysilicon, tungsten, or molybdenum. The sacrificial layer may secure a region to form the source layer and may be replaced with a source layer in a subsequent process.

As an embodiment, the source structure 50 may include a first sacrificial layer 50A and a first source layer 50C, and the source structure 50 may further include a second sacrificial layer 50B that is interposed between the first sacrificial layer 50A and the first source layer 50C. The first sacrificial layer 50A may include polysilicon and may include an impurity of an N-type. The first sacrificial layer 50A may be a polysilicon layer with the impurity of an N-type at a high concentration. The second sacrificial layer 50B may include an oxide. The first source layer 50C may include polysilicon and may include an impurity of an N-type. The first source layer 50C may be a polysilicon layer with the impurity of an N-type at a high concentration.

Subsequently, the stack ST may be formed on the source structure 50. The stack ST may include alternately stacked first material layers 51 and second material layers 52. Subsequently, a hard mask pattern 59 may be formed on the stack ST. Subsequently, the first opening OP1 that passes through the stack ST may be formed.

Subsequently, the channel structure CH may be formed in the first opening OP1. The channel structure CH may include a sacrificial layer 53, a memory layer M, a channel layer 57, or an insulating core 58, or may include a combination thereof. Here, the memory layer M may include a blocking layer 54, a data storage layer 55, or a tunnel insulating layer 56, or may include a combination thereof.

Figure 3B:
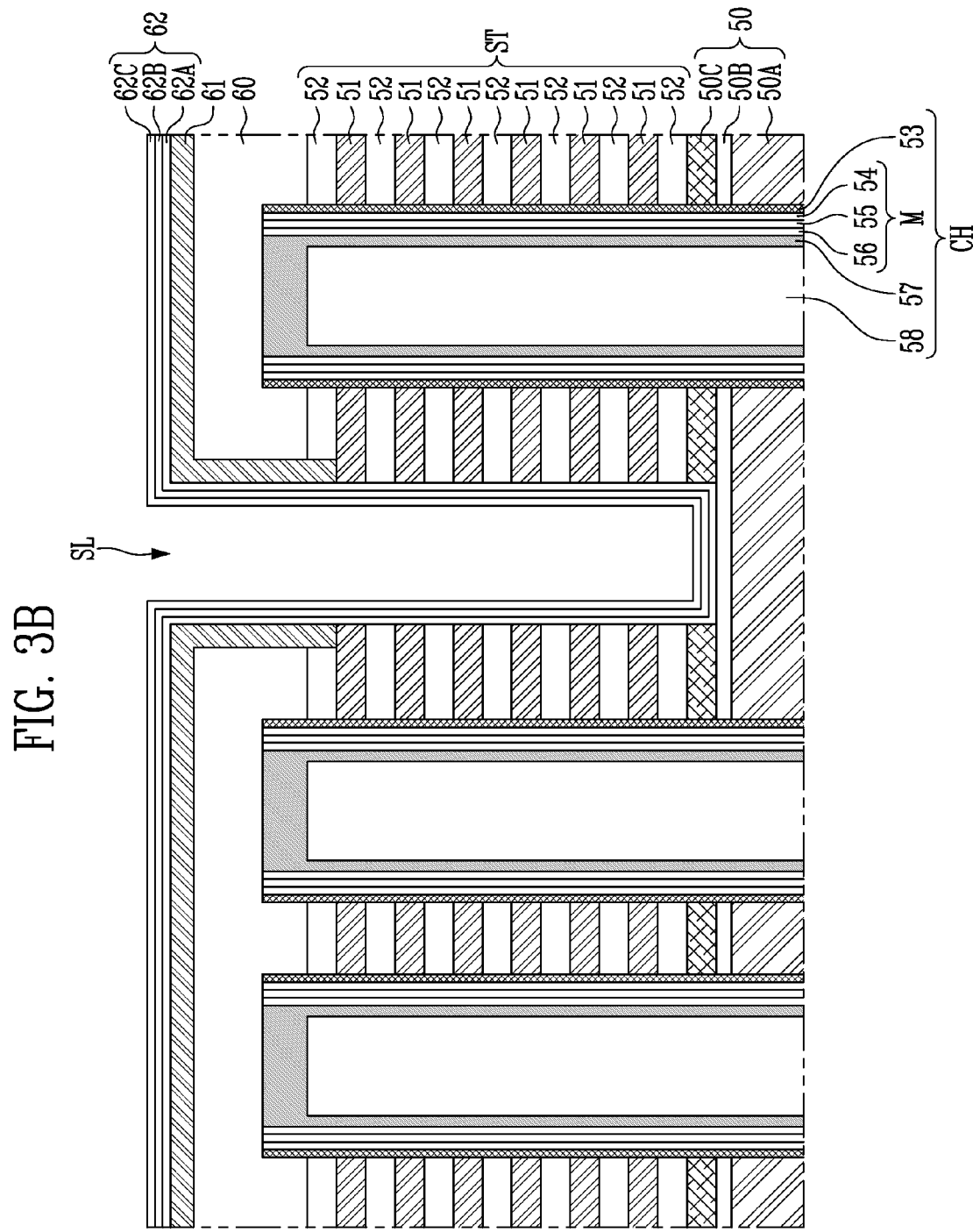

Referring to FIG. 3B, after the hard mask pattern 59 of FIG. 3A is removed, a capping insulating layer 60 may be formed. Subsequently, a preliminary slit that passes through the capping insulating layer 60 may be formed, and a protective pattern 61 may be formed on a surface of the capping insulating layer 60. Subsequently, the protective pattern 61 and the stack ST may be etched to form the slit SL. As a result, the slit SL that passes through the capping insulating layer 60 and the stack ST may be formed. The slit SL may expose the source structure 50 that is positioned under the stack ST. As an embodiment, the slit SL may pass through the first source layer 50C and expose the second sacrificial layer 50B.

Subsequently, a protective spacer 62 may be formed in the slit SL. The protective spacer 62 may protect the stack ST in the process of replacing the first sacrificial layer 50A and the second sacrificial layer 50B with a second source layer. The protective spacer 62 may be a single layer or may include multiple layers. As an embodiment, the protective spacer 62 may include a first spacer material layer 62A, a second spacer material layer 62B, and a third spacer material layer 62C. The second spacer material layer 62B may include a material with a high etching selectivity with respect to the first spacer material layer 62A and the third spacer material layer 62C. The first spacer material layer 62A and the third spacer material layer 62C may include nitride, and the second spacer material layer 62B may include oxide.

Figure 3C:
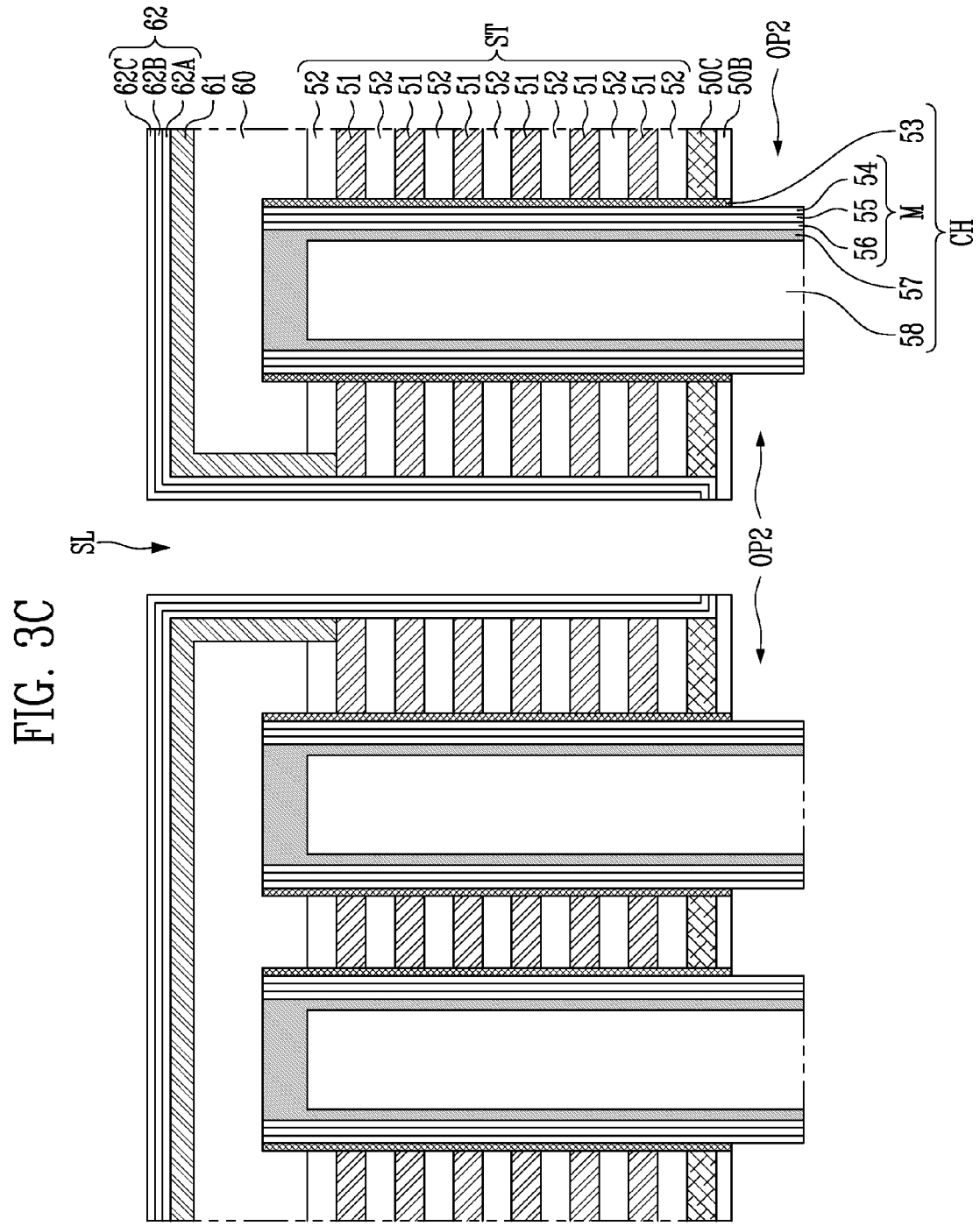

Referring to FIG. 3C, the protective spacer 62 may be etched to expose the source structure 50. The source structure 50 may be exposed by etching the protective spacer 62 using an etchback process. In the etchback process, the second sacrificial layer 50B may be etched, and the first sacrificial layer 50A may be exposed.

Subsequently, the first sacrificial layer 50A may be removed through the slit SL to form the second opening OP2. The second opening OP2 may be formed by selectively etching the first sacrificial layer 50A, and the sacrificial layer 53 may be exposed in the second opening OP2. Subsequently, the sacrificial layer 53 may be etched. As a result, the blocking layer 54 may be exposed in the second opening OP2. When the first sacrificial layer 50A and the sacrificial layer 53 are etched, the stack ST may be protected by the protective spacer 62.

Figure 3D:
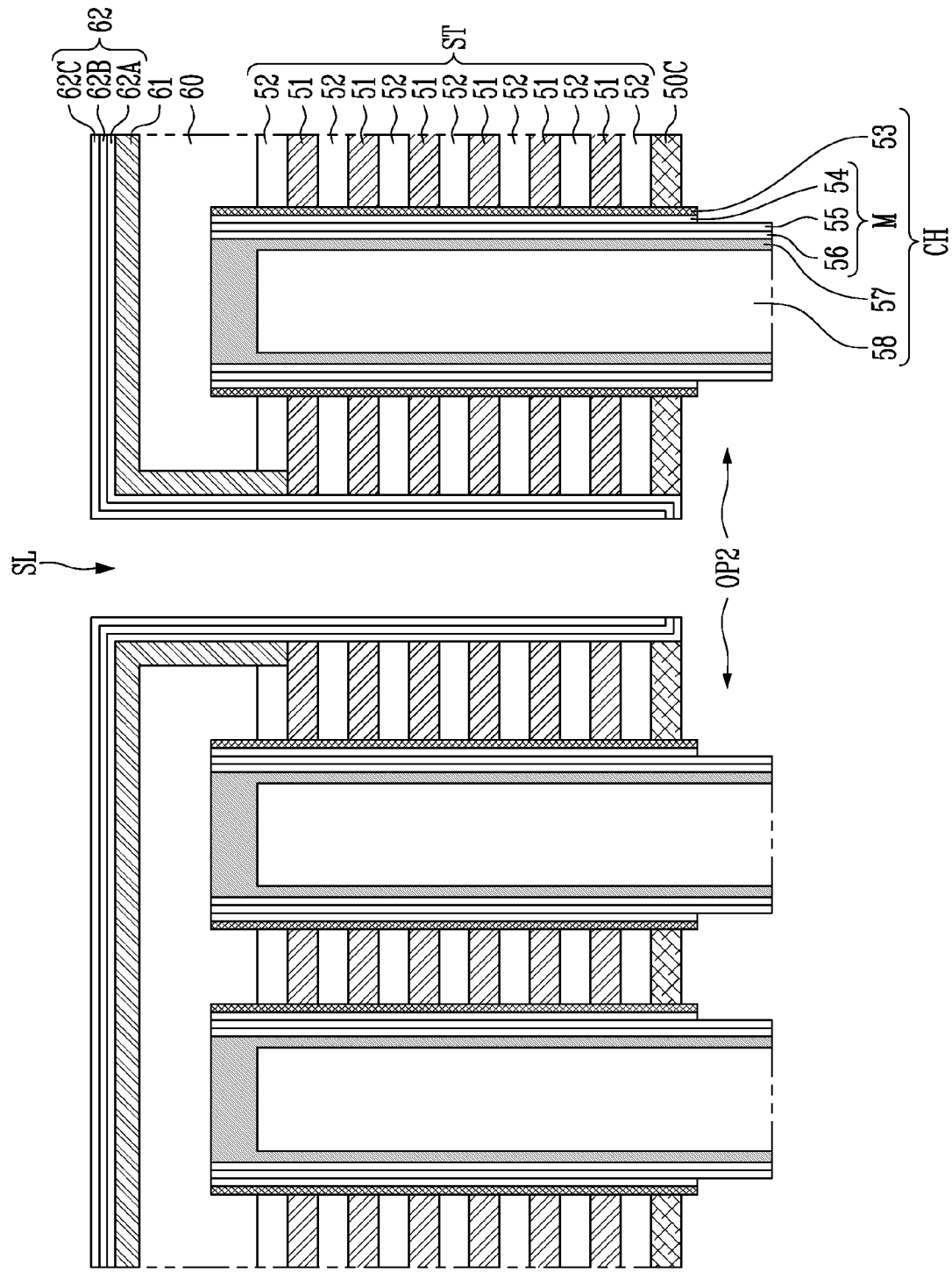

Referring to FIG. 3D, the blocking layer 54 may be etched through the second opening OP2. As a result, the data storage layer 55 may be exposed in the second opening OP2. When the blocking layer 54 is etched, the second sacrificial layer 50B may be etched together, and the first source layer 50C may be exposed in the second opening OP2. When the blocking layer 54 is etched, the stack ST may be protected by the protective spacer 62 and the first source layer 50C.

Figure 3E:
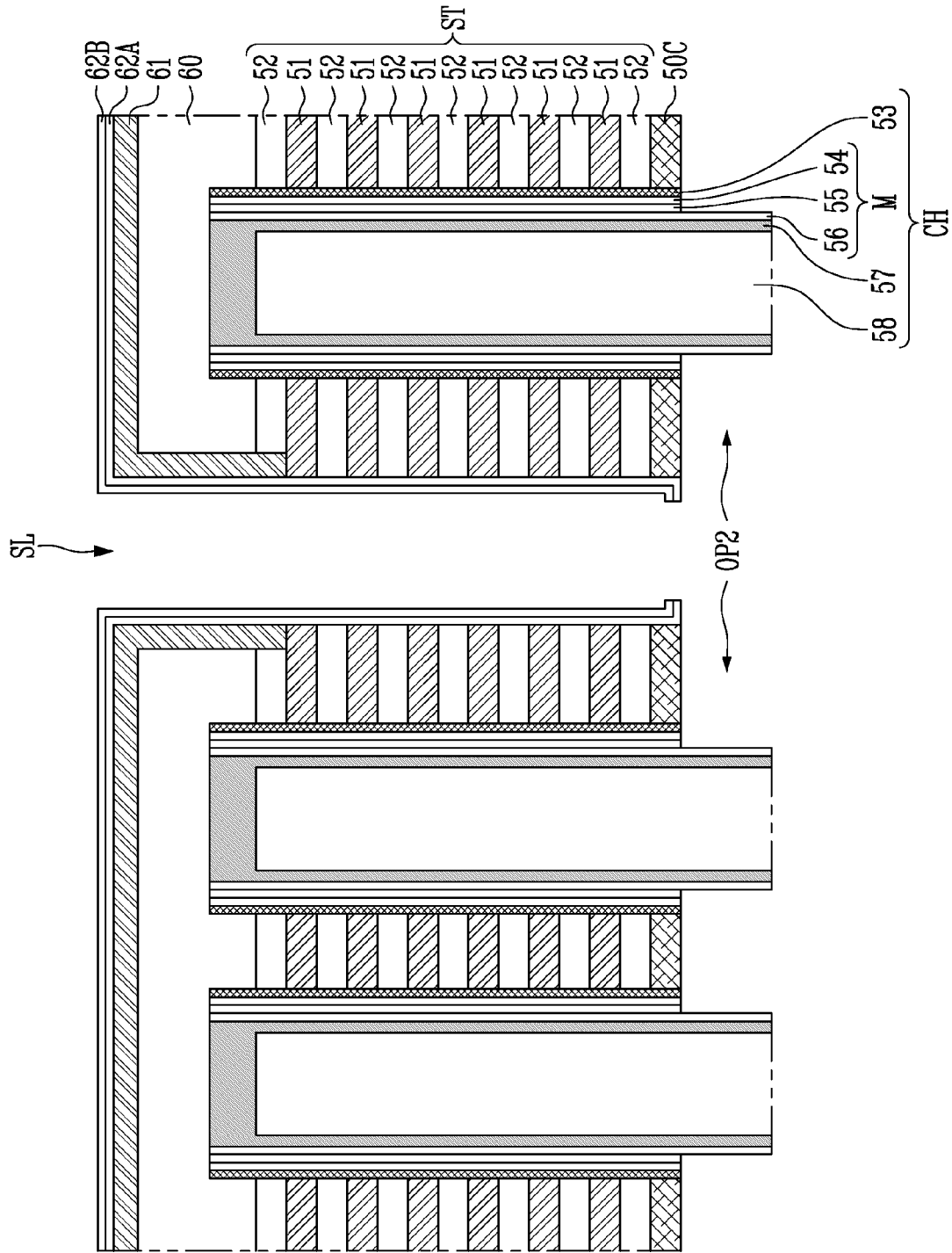

Referring to FIG. 3E, the data storage layer 55 may be etched through the second opening OP2. As a result, the tunnel insulating layer 56 may be exposed in the second opening OP2. When the data storage layer 55 is etched, the third spacer 62C may be etched together. Even though the third spacer 62C is etched, the stack ST may be protected by the second spacer 62B.

Figure 3F:
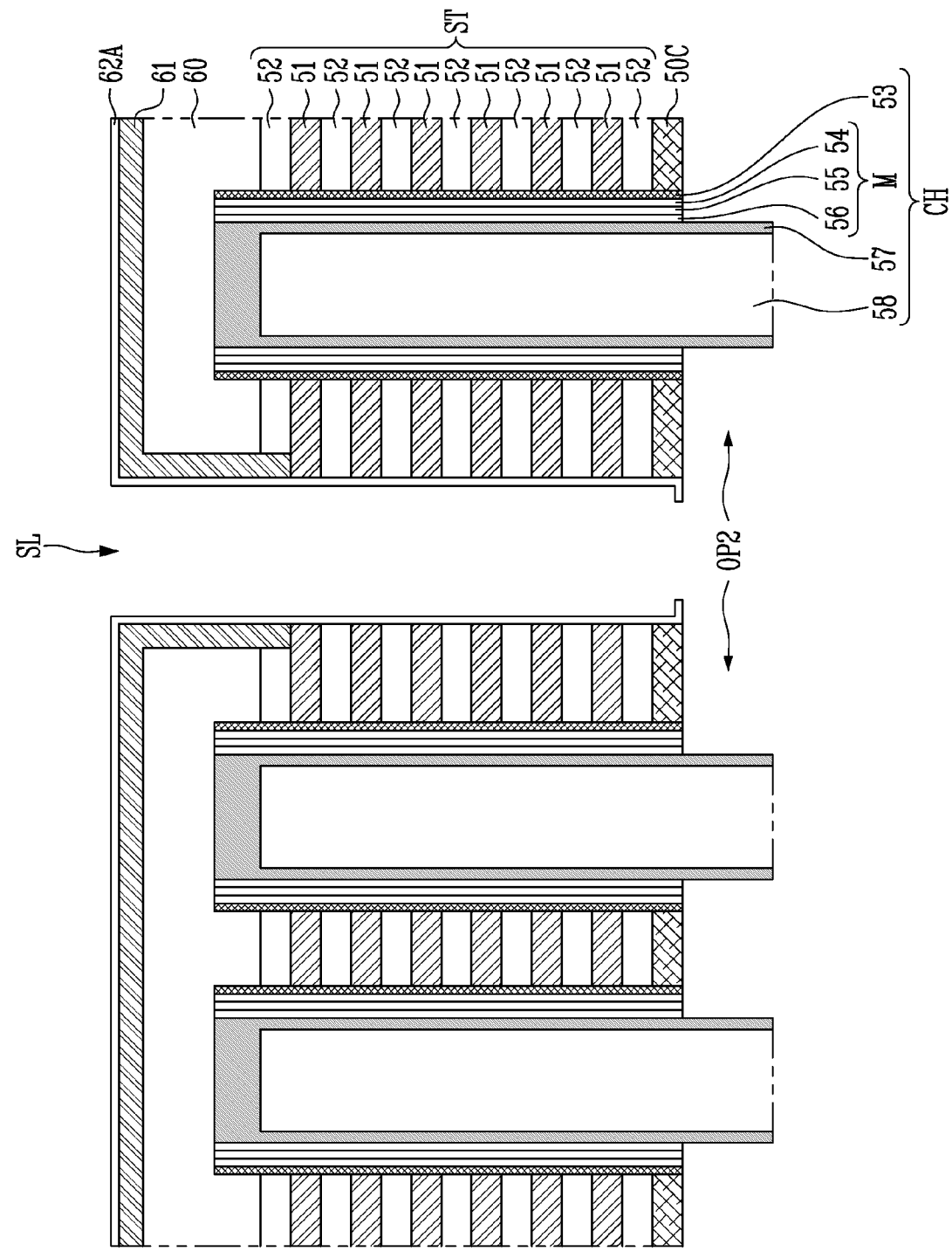

Referring to FIG. 3F, the tunnel insulating layer 56 may be etched through the second opening OP2. As a result, the channel layer 57 may be exposed in the second opening OP2. When the tunnel insulating layer 56 is etched, the second spacers 62B may be etched together. Even though the second spacer 62B is etched, the stack ST may be protected by the first spacer 62A.

Figure 3G:
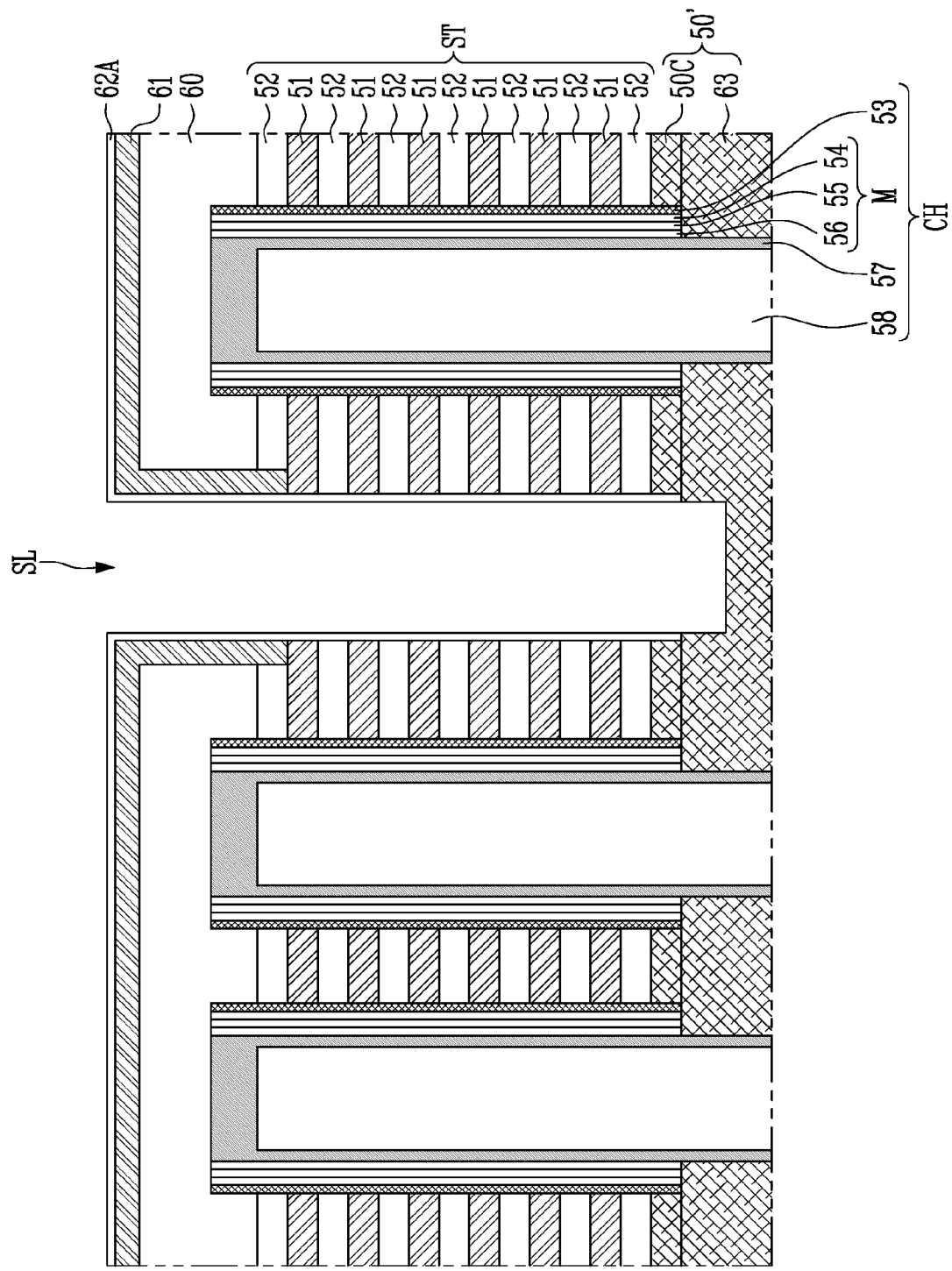

Referring to FIG. 3G, a second source layer 63 may be formed in the second opening OP2. The second source layer 63 may be directly connected to the channel layer 57. As a result, a source structure 50' with the first source layer 50C and the second source layer 63 may be formed.

Subsequently, after removing the first spacer 62A, a process for separating the memory layer M into memory patterns may be performed. Subsequent processes may be the same as or similar to that described with reference to FIGS. 2E to 2M. Alternatively, before replacing the first sacrificial layer 50A and the second sacrificial layer 50B with the second source layer 63, the memory layer M may be separated into the memory patterns MP.

Figure 4A:
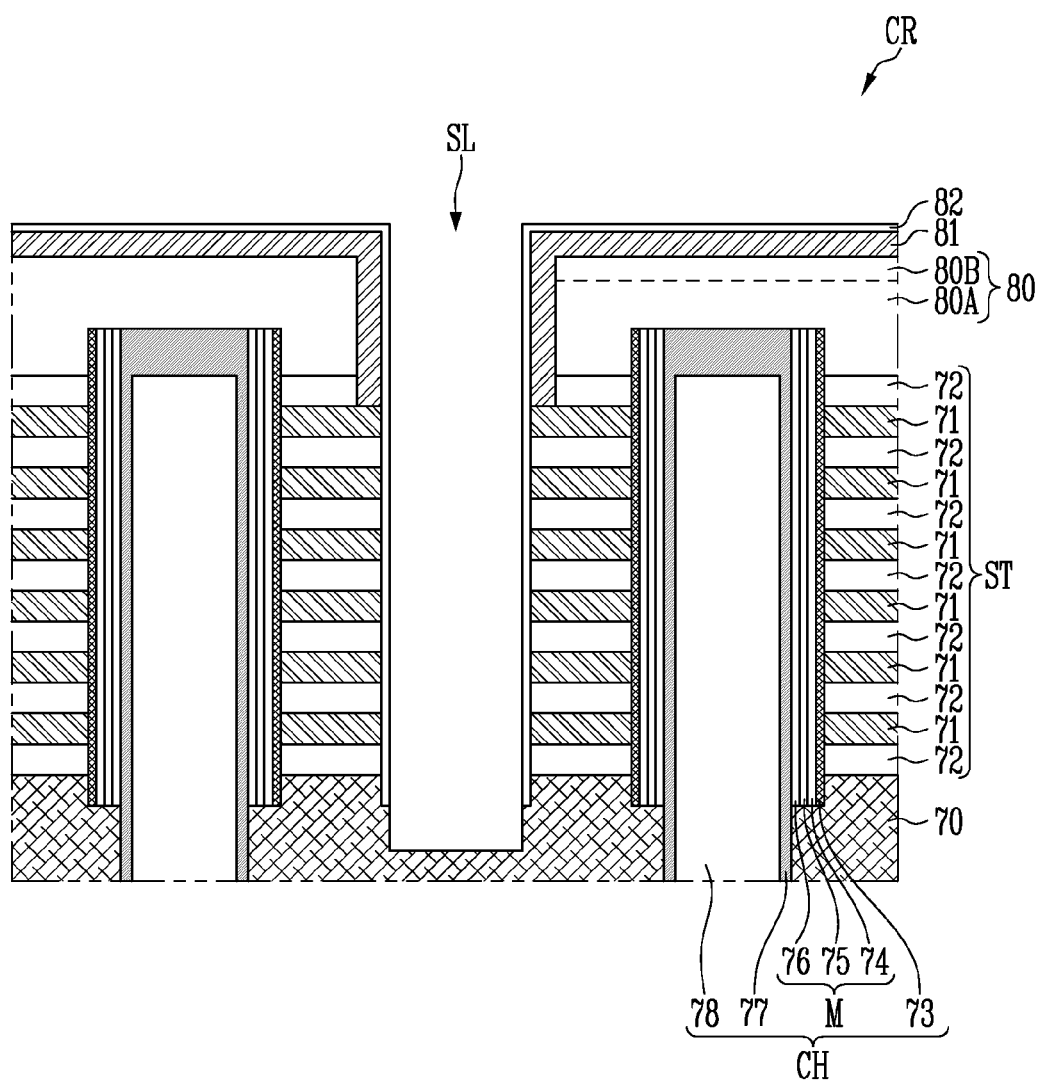
FIGS. 4A, 5A, 6A, 7A, and 8A, and 4B, 5B, 6B, 7B, and 8B are diagrams illustrating a method of manufacturing a semiconductor device according to an embodiment of the present disclosure.

FIGS. 4A to 8A and 4B to 8B are diagrams illustrating a method of manufacturing a semiconductor device according to an embodiment of the present disclosure. FIG. 4A may be a cross-sectional view of a cell region, and FIG. 4B may be a cross-sectional view of a contact region. Hereinafter, contents repetitive to the previously described contents are omitted.

Figure 4B:
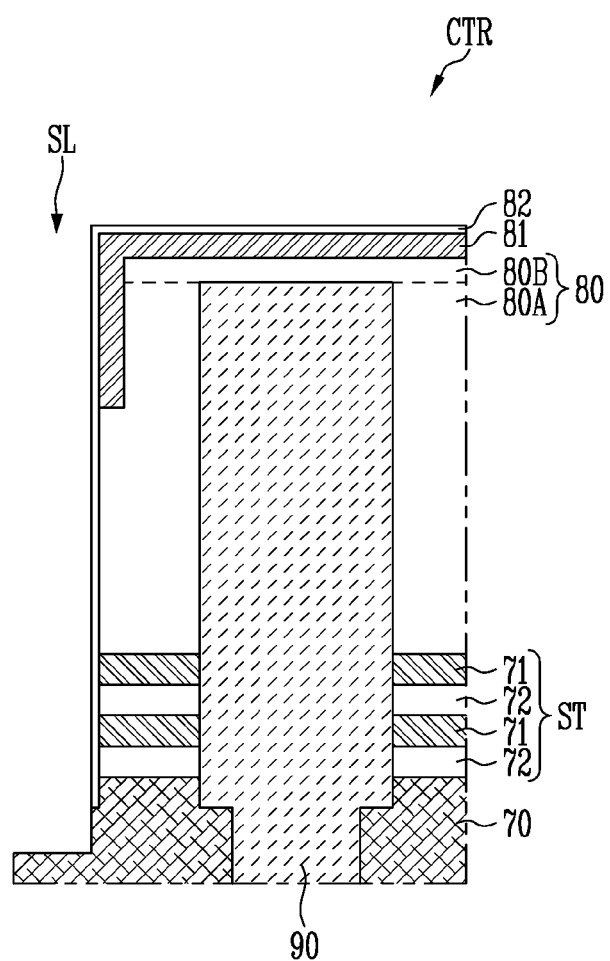

Referring to FIGS. 4A and 4B, the stack ST may be formed on a source structure 70. The stack ST may include alternately stacked first material layers 71 and second material layers 72. The stack ST may include the cell region CR and the contact region CTR. Subsequently, the channel structure CH that passes through the stack ST may be formed. The channel structure CH may include a sacrificial layer 73, a memory layer M, a channel layer 77, or an insulating core 78, or may include a combination thereof. The memory layer M may include a blocking layer 74, a data storage layer 75, or a tunnel insulating layer 76, or may include a combination thereof.

Subsequently, a capping insulating layer 80 may be formed on the stack ST. As an embodiment, after patterning the contact region CTR of the stack ST in a step shape, a first capping insulating layer 80A may be formed. Subsequently, after forming a support 90 that passes through the contact region CTR of the stack ST, a second capping insulating layer 80B may be formed. The support 90 may include an insulating material, such as oxide or nitride.

Subsequently, the slit SL that passes through the capping insulating layer 80 and the stack ST may be formed. In an embodiment, after forming a preliminary slit passing through the capping insulating layer 80 and an uppermost insulating layer 72, a protective pattern 81 may be formed. Subsequently, the protective pattern 81 and the stack ST may be etched to form the slit SL. The slit SL may be formed in the cell region CR and the contact region CTR.

Subsequently, when the source structure 70 includes a sacrificial layer, a process for replacing the sacrificial layer with a source layer may be performed. The replacement process may be performed or performed simultaneously in the cell region CR and the contact region CTR. A protective spacer 82 for protecting the stack ST may be used during the replacement process, and the protective spacer 82 may remain on an inner wall of the slit SL after the replacement process is performed. The remaining protective spacer 82 may be a single layer or multiple layers.

Figure 5A:
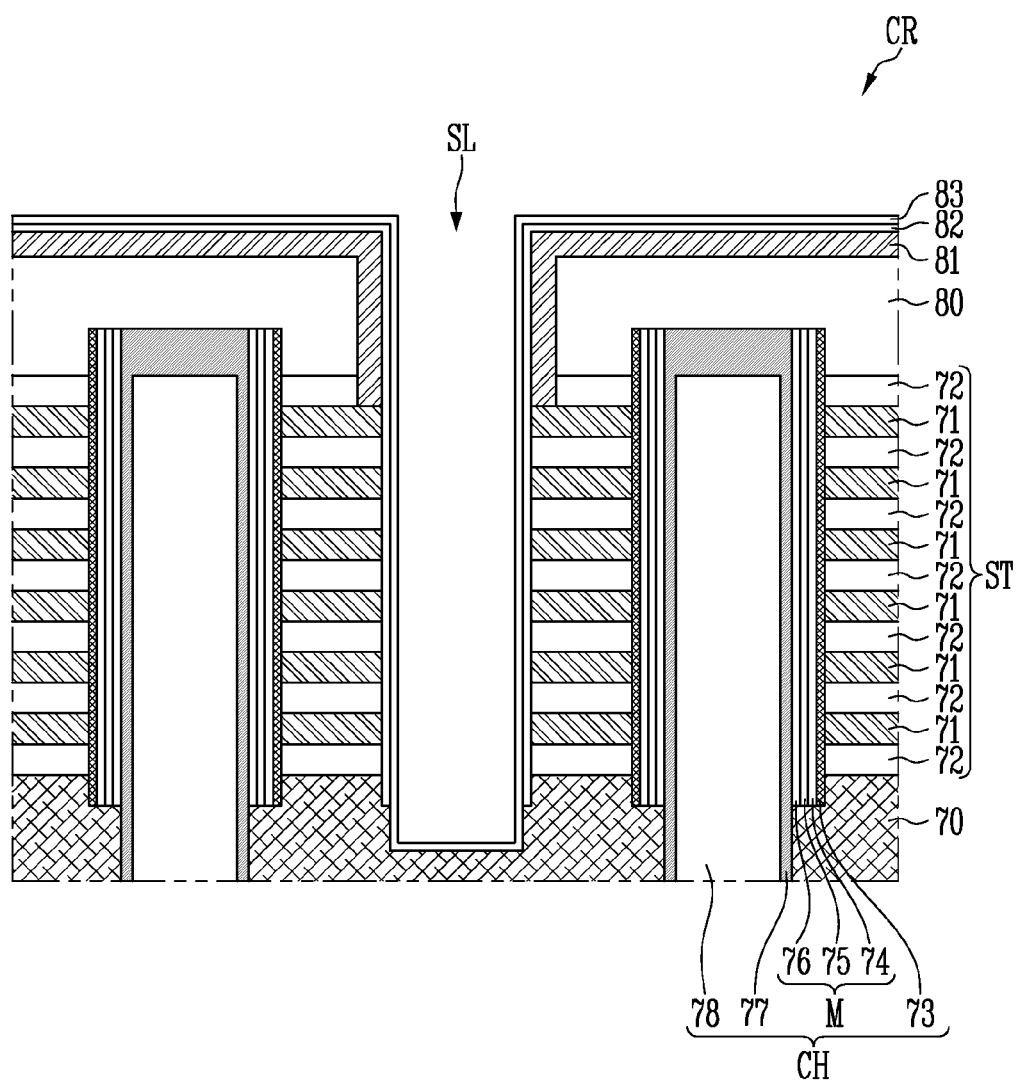
Figure 5B:
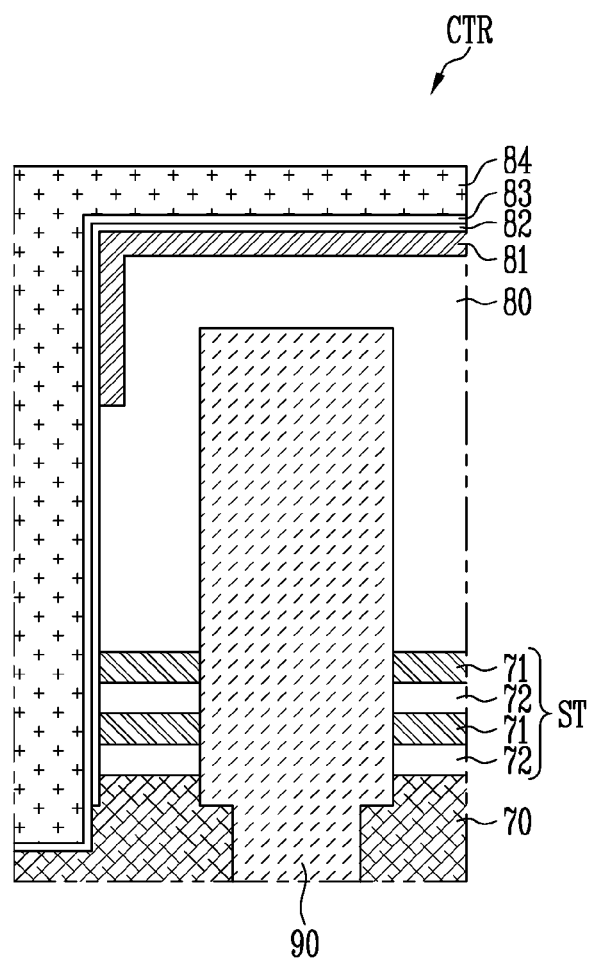

Referring to FIGS. 5A and 5B, a closing layer 83 may be formed. The closing layer 83 may be formed in the cell region CR and the contact region CTR. The closing layer 83 may include an insulating material, such as oxide or nitride. Subsequently, a mask pattern 84 that covers the contact region CTR and opens the cell region CR may be formed.

Figure 6A:
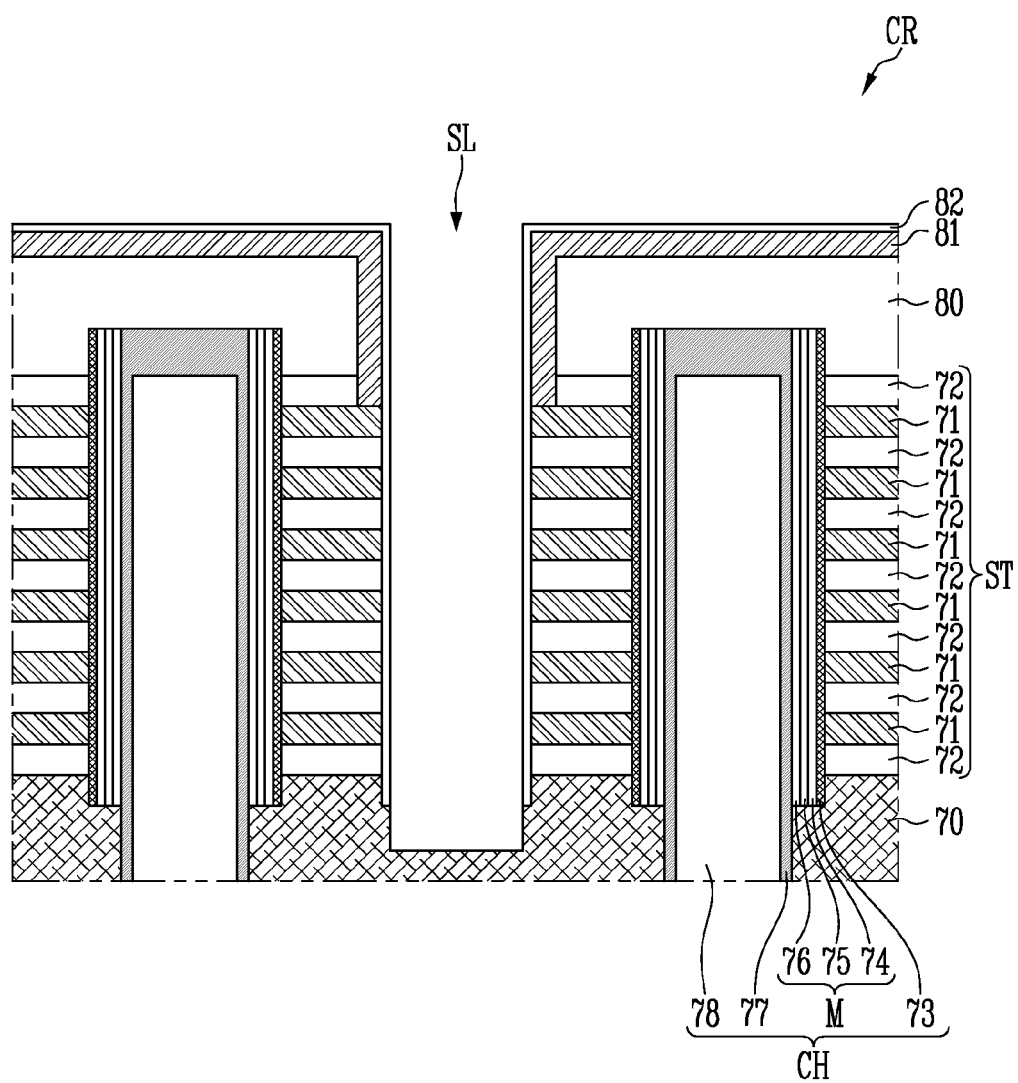
Figure 6B:
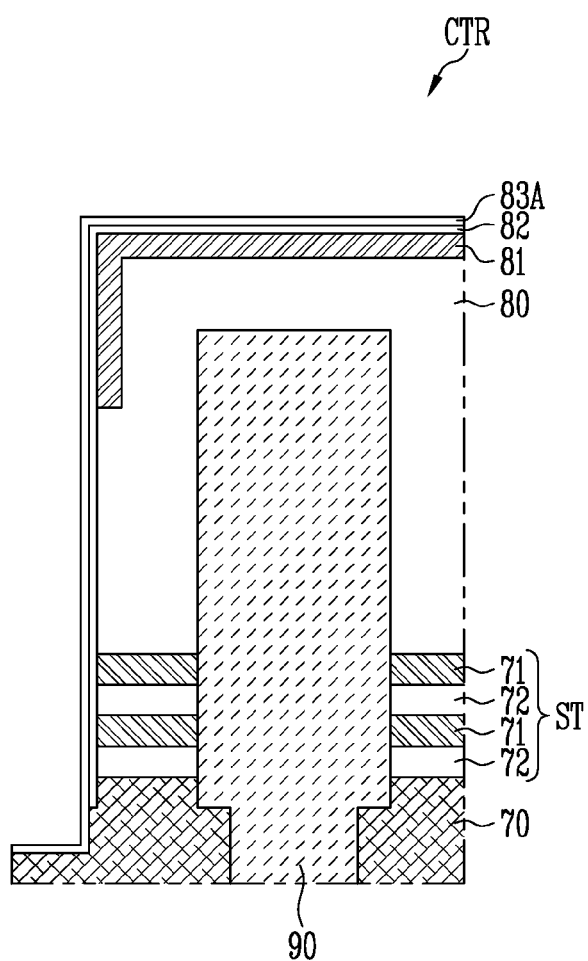

Referring to FIGS. 6A and 6B, a closing pattern 83A may be formed by etching the closing layer 83 by using the mask pattern 84 as an etching barrier. The closing pattern 83A may have a shape that covers the contact region CTR of the stack ST and opens the cell region CR. Layers of the contact region CTR may be protected in a subsequent process by covering the contact region CTR with the closing pattern 83A.

Figure 7A:
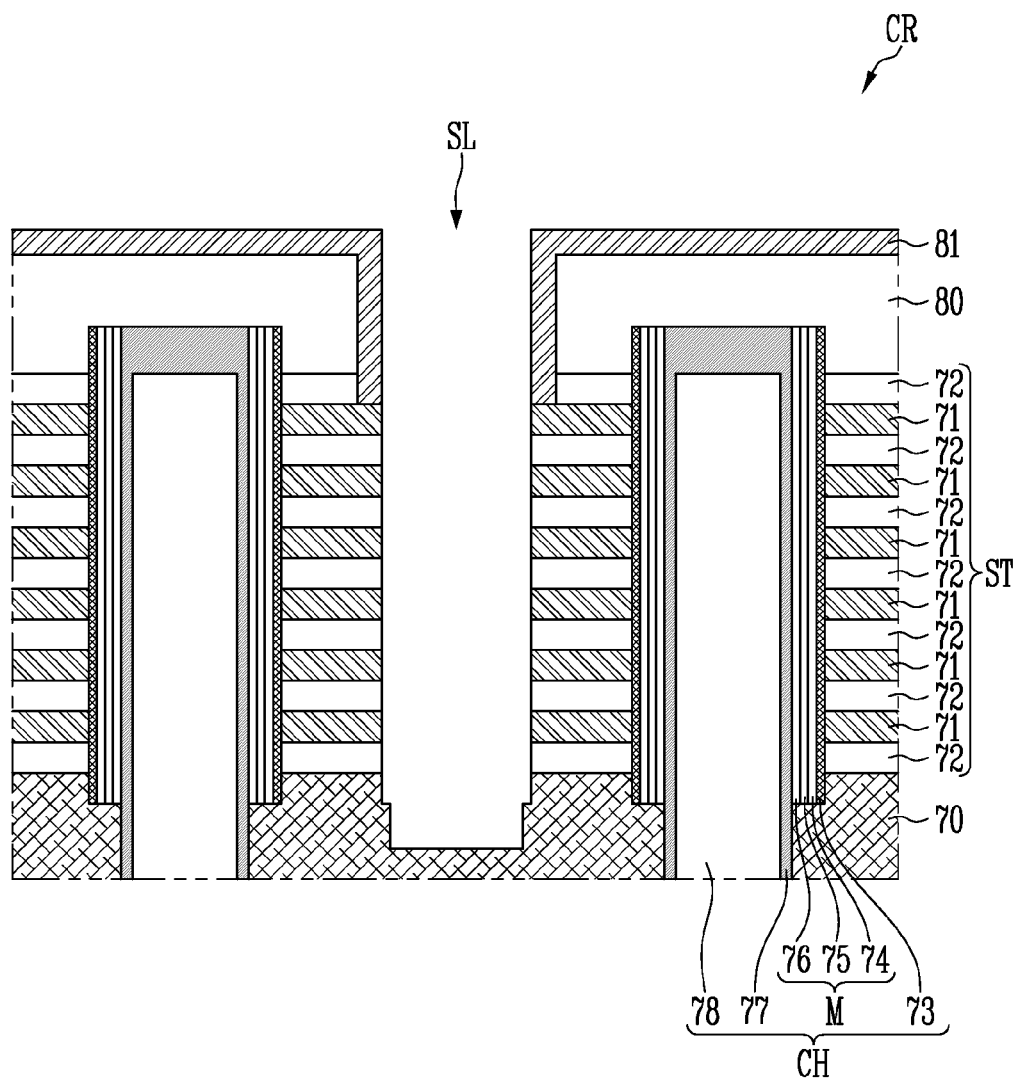
Figure 7B:
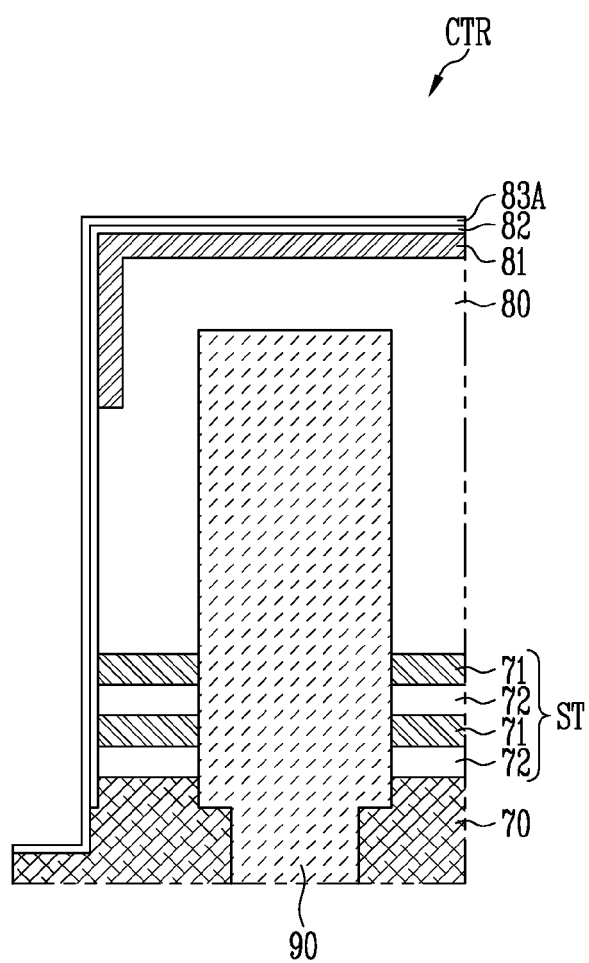

Referring to FIGS. 7A and 7B, the remaining protective spacers 82 may be removed. As a result, the first material layers 71 and the second material layers 72 of the cell region CR may be exposed. When the protective spacer 82 of the cell region CR is removed, the protective spacer 82 of the contact region CTR may be protected by the closing pattern 83A. Therefore, the capping insulating layer 80, the first material layers 71, and the second material layers 72 of the contact region CTR might not be exposed.

Figure 8A:
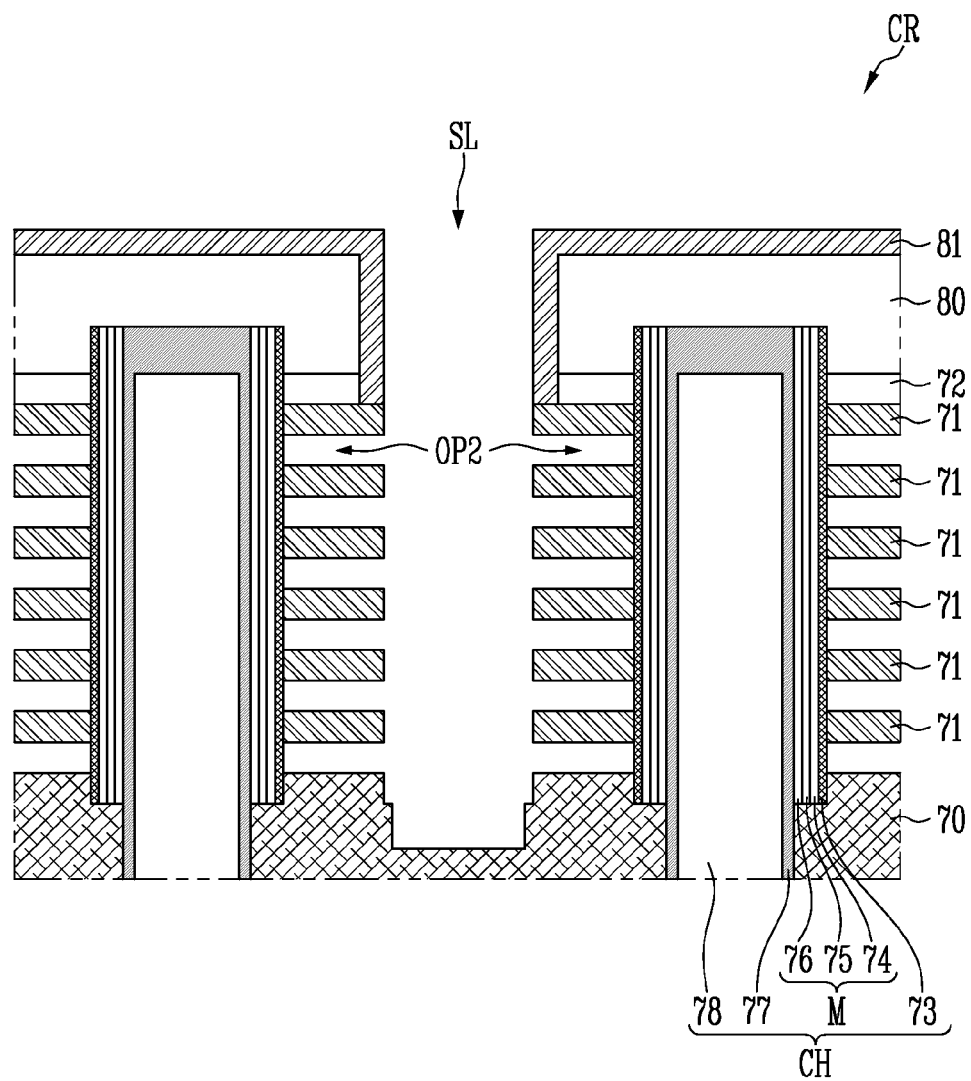
Figure 8B:
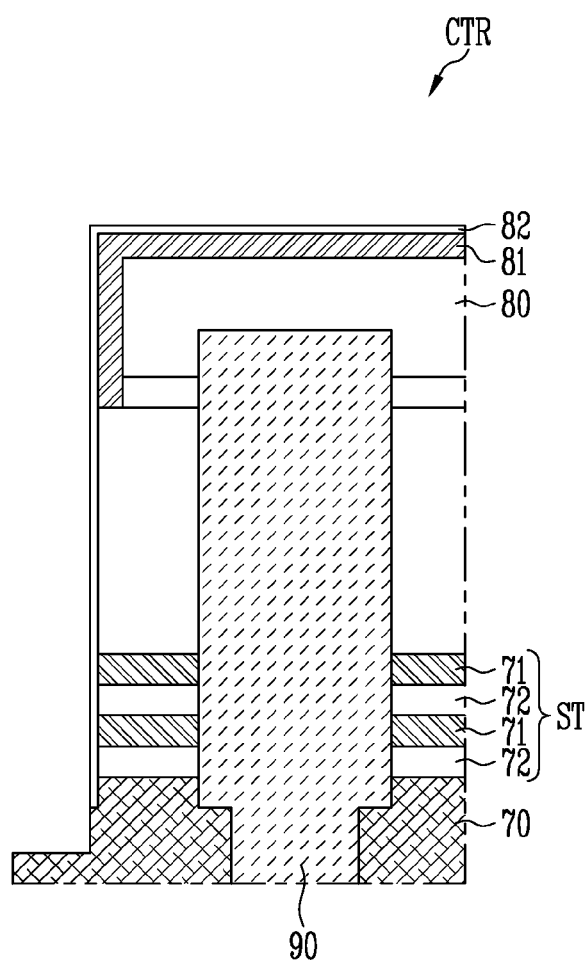

Referring to FIGS. 8A and 8B, the second openings OP2 are formed by selectively etching the second material layers 72 through the slit SL. When the second material layers 72 are etched, the closing pattern 83A of the contact region CTR may be etched together, and the protective spacer 82 of the contact region CTR may be exposed. Since the second material layers 72 of the contact region CTR are protected by the protective spacer 82, the second openings OP2 might not be formed in the contact region CTR.

Subsequently, the memory layer M may be separated into the memory patterns MP through the second openings OP2. Subsequent processes may be the same as or similar to that described with reference to FIGS. 2E to 2M.

Figure 9:
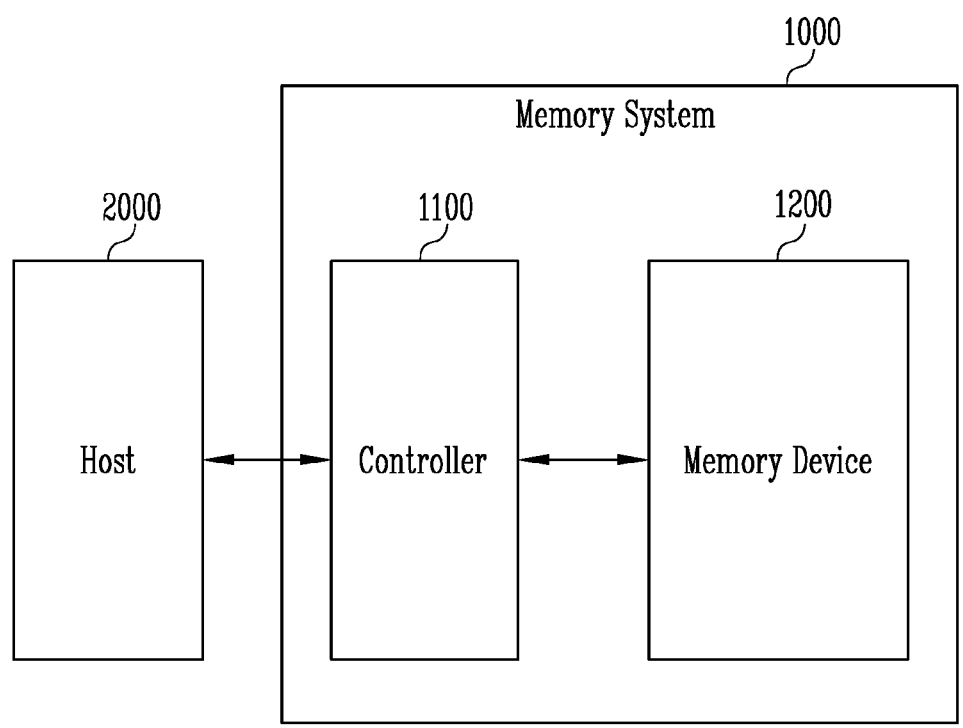
FIG. 9 is a diagram illustrating a memory system according to an embodiment of the present disclosure.

FIG. 9 is a diagram illustrating a memory system according to an embodiment of the present disclosure.

Referring to FIG. 9, the memory system 1000 may include a memory device 1200 in which data is stored, and a controller 1100 communicating between the memory device 1200 and a host 2000.

The host 2000 may be a device or system that stores data in the memory system 1000 or retrieves data from the memory system 1000. The host 2000 may generate requests for various operations and may output the generated requests to the memory system 1000. The requests may include a program request for a program operation, a read request for a read operation, an erase request for an erase operation, and the like. The host 2000 may communicate with the memory system 1000 through various interfaces, such as peripheral component interconnect express PCIe), advanced technology attachment (ATA), serial ATA (SATA), parallel ATA (PATA), serial attached SCSI (SAS), nonvolatile memory express (NVMe), universal serial bus (USB), multi-media card (MMC), enhanced small disk interface (ESDI), or integrated drive electronics (IDE).

The host 2000 may include at least one of a computer, a portable digital device, a tablet, a digital camera, a digital audio player, a television, a wireless communication device, or a cellular phone, but embodiments of the present disclosure are not limited thereto.

The controller 1100 may generally control an operation of the memory system 1000. The controller 1100 may control the memory device 1200 according to the request of the host 2000. The controller 1100 may control the memory device 1200 so that the program operation, the read operation, the erase operation, and the like may be performed according to the request of the host 2000. Alternatively, the controller 1100 may perform a background operation or the like for improving performance of the memory system 1000 even though the request of the host 2000 does not exist.

The controller 1100 may transmit a control signal and a data signal to the memory device 1200 in order to control the operation of the memory device 1200. The control signal and the data signal may be transmitted to the memory device 1200 through different input/output lines. The data signal may include a command, an address, or data. The control signal may be used to divide a section in which the data signal is input.

The memory device 1200 may perform the program operation, the read operation, the erase operation, and the like under control of the controller 1100. The memory device 1200 may be implemented with a volatile memory device in which stored data is destroyed when power supply is cut off, or a nonvolatile memory device in which stored data is maintained even though power supply is cut off. The memory device 1200 may be the semiconductor device with the structure that is described above with reference to FIGS. 1A to 1D. The memory device 1200 may be the semiconductor device that is manufactured through the manufacturing method that is described above with reference to FIGS. 2A to 8B. As an embodiment, the semiconductor memory device may include a source structure, a stack that is positioned on the source structure with alternately stacked conductive layers and insulating layers, a channel layer passing through the stack and extending to the source structure, a capping insulating layer on the stack, and a slit structure passing through the capping insulating layer and the stack, and a sidewall of the insulating layers may protrude farther toward the slit structure compared to a sidewall of the capping insulating layer.

Figure 10:
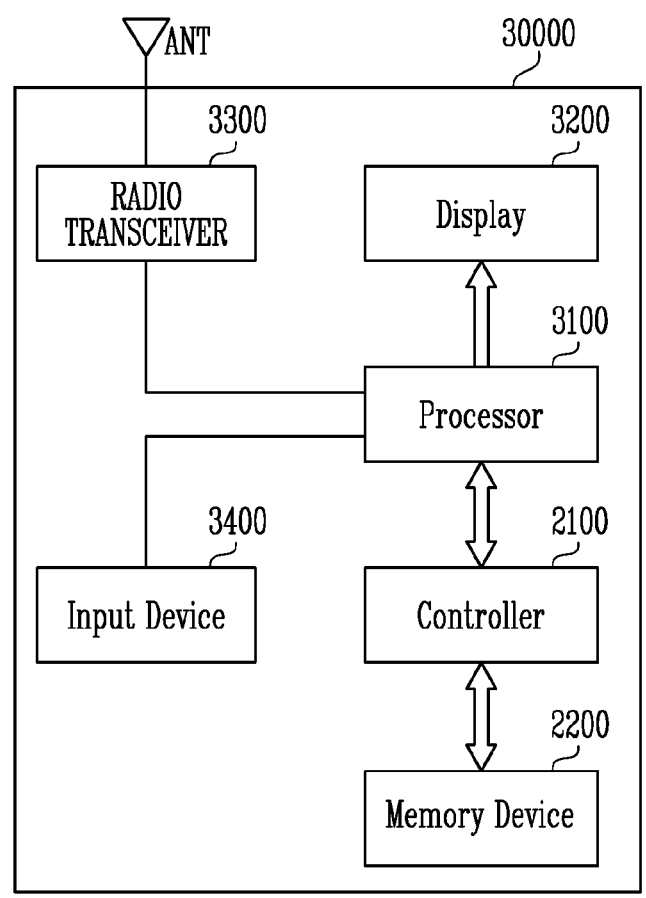
FIG. 10 is a diagram illustrating a memory system according to an embodiment of the present disclosure.

FIG. 10 is a diagram illustrating a memory system according to an embodiment of the present disclosure.

Referring to FIG. 10, the memory system 30000 may be implemented as a cellular phone, a smart phone, a tablet, a personal computer (PC), a personal digital assistant (PDA), or a wireless communication device. The memory system 30000 may include a memory device 2200 and a controller 2100 capable of controlling an operation of the memory device 2200.

The controller 2100 may control a data access operation, for example, a program operation, an erase operation, a read operation, or the like, of the memory device 2200 through a processor 3100.

Data that is programmed in the memory device 2200 may be output through a display 3200 based on the controller 2100.

A radio transceiver 3300 may transmit and receive a radio signal through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the controller 2100 or the display 3200. The controller 2100 may transmit the signal processed by the processor 3100 to the memory device 2200. In addition, the radio transceiver 3300 may convert a signal output from the processor 3100 into a radio signal, and output the converted radio signal to an external device through the antenna ANT. An input device 3400 may be a device that is capable of inputting a control signal to control the operation of the processor 3100 or data to be processed by the processor 3100. The input device 3400 may be implemented as a pointing device, such as a touch pad or a computer mouse, a keypad, or a keyboard. The processor 3100 may control an operation of the display 3200 so that data that is output from the controller 2100, data that is output from the radio transceiver 3300, or data that is output from the input device 3400 is output through the display 3200.

According to an embodiment, the controller 2100 that is capable of controlling the operation of memory device 2200 may be implemented as a part of the processor 3100 and may be implemented as a chip separate from the processor 3100.

Figure 11:
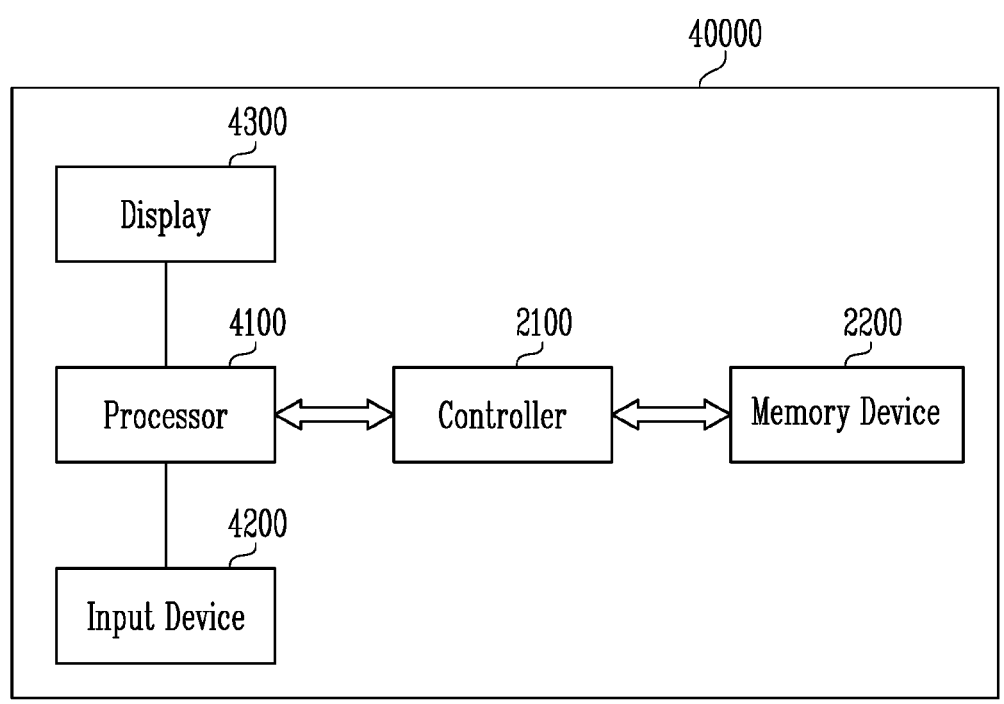
FIG. 11 is a diagram illustrating a memory system according to an embodiment of the present disclosure.

FIG. 11 is a diagram illustrating a memory system according to an embodiment of the present disclosure.

Referring to FIG. 11, the memory system 40000 may be implemented as a personal computer (PC), a tablet, a netbook, an e-reader, a personal digital assistant (PDA), a portable multimedia player (PMP), an MP3 player, or an MP4 player.

The memory system 40000 may include the memory device 2200 and the controller 2100 that is capable of controlling a data process operation of the memory device 2200.

A processor 4100 may output data stored in the memory device 2200 through a display 4300, according to data input through an input device 4200. For example, the input device 4200 may be implemented as a point device, such as a touch pad or a computer mouse, a keypad, or a keyboard.

The processor 4100 may control the overall operation of the memory system 40000 and may control the operation of the controller 2100. According to an embodiment, the controller 2100 that is capable of controlling the operation of memory device 2200 may be implemented as a part of the processor 4100 or may be implemented as a chip that is separate from the processor 4100.

Figure 12:
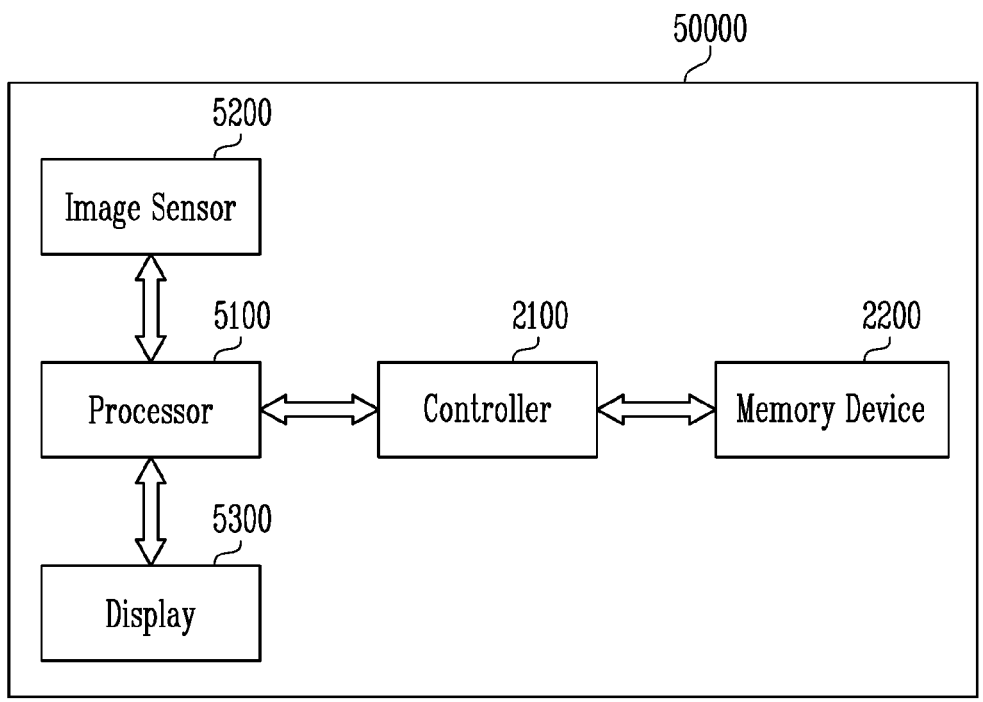
FIG. 12 is a diagram illustrating a memory system according to an embodiment of the present disclosure.

FIG. 12 is a diagram illustrating a memory system according to an embodiment of the present disclosure.

Referring to FIG. 12, the memory system 50000 may be implemented as an Image processing device, for example, a digital camera, a portable phone that is provided with a digital camera, a smart phone that is provided with a digital camera, or a tablet that is provided with a digital camera.

The memory system 50000 may include the memory device 2200 and the controller 2100 that is capable of controlling a data process operation, for example, a program operation, an erase operation, or a read operation, of the memory device 2200.

An image sensor 5200 of the memory system 50000 may convert an optical image into digital signals. The converted digital signals may be transmitted to a processor 5100 or the controller 2100. Based on the processor 5100, the converted digital signals may be output through a display 5300 or stored in the memory device 2200 through the controller 2100. In addition, data that is stored in the memory device 2200 may be output through the display 5300 based on of the processor 5100 or the controller 2100.

According to an embodiment, the controller 2100 capable of controlling the operation of memory device 2200 may be implemented as a part of the processor 5100 or may be implemented as a chip separate from the processor 5100.

Figure 13:
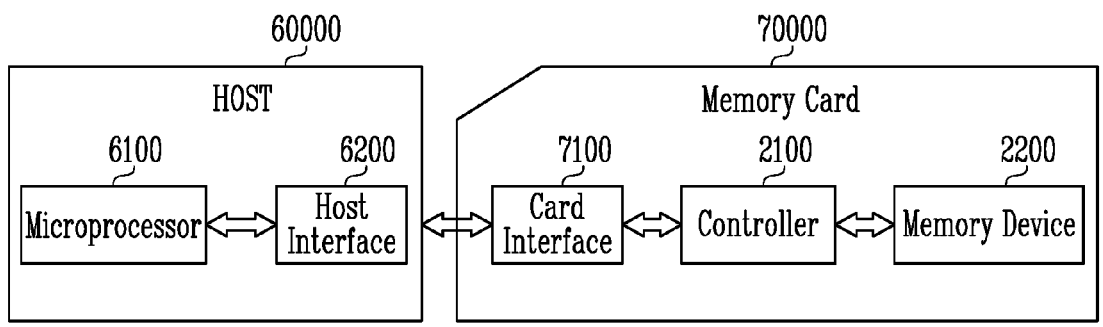
FIG. 13 is a diagram illustrating a memory system according to an embodiment of the present disclosure.

FIG. 13 is a diagram illustrating a memory system according to an embodiment of the present disclosure.

Referring to FIG. 13, the memory system 70000 may be implemented as a memory card or a smart card. The memory system 70000 may include the memory device 2200, the controller 2100, and a card interface 7100.

The controller 2100 may control the exchange of data between the memory device 2200 and the card interface 7100. According to an embodiment, the card interface 7100 may be a secure digital (SD) card interface or a multi-media card (MMC) interface, but is not limited thereto.

The card interface 7100 may interface the data exchange between a host 60000 and the controller 2100 according to a protocol of the host 60000. According to an embodiment, the card interface 7100 may support a universal serial bus (USB) protocol and an interchip (IC)-USB protocol. Here, the card interface 7100 may refer to hardware that is capable of supporting a protocol that is used by the host 60000, software that is installed in the hardware, or a signal transmission method.

When the memory system 70000 is connected to a host interface 6200 of the host 60000 such as a PC, a tablet, a digital camera, a digital audio player, a mobile phone, a console video game hardware, or a digital set-top box, the host interface 6200 may perform data communication with the memory device 2200 through the card interface 7100 and the controller 2100 under control of a microprocessor 6100.

What is claimed is:

1. A semiconductor device comprising:
   a source structure;
   a stack positioned over the source structure with alternately stacked conductive layers and insulating layers;
   a channel layer passing through the stack and extending to the source structure;
   a capping insulating layer over the stack;
   a dummy memory pattern interposed between the channel layer and the capping insulating layer; and
   a slit structure passing through the capping insulating layer and the stack,
   wherein the insulating layers include an uppermost insulating layer and remaining insulating layers, and
   wherein each of the remaining insulating layers comprises a sidewall, and each sidewall protrudes farther toward the slit structure compared to a sidewall of the capping insulating layer.

2. The semiconductor device of claim 1, wherein the uppermost insulating layer includes a first sidewall that faces the slit structure, the remaining insulating layers include second sidewalls that face the slit structure, the capping insulating layer includes a third sidewall facing the slit structure, and the second sidewalls protrude farther toward the slit structure compared to the first sidewall.

3. The semiconductor device of claim 2, wherein the first sidewall is aligned with the third sidewall.

4. The semiconductor device of claim 1, wherein the slit structure comprises:
   a source contact passing through the capping insulating layer and the stack; and
   an insulating spacer surrounding a sidewall of the source contact.

5. The semiconductor device of claim 4, wherein the source contact includes a first portion that corresponds to an uppermost insulating layer, among the insulating layers, and a second portion that is positioned under the first portion, and
   wherein the first portion is wider than the second portion.

6. The semiconductor device of claim 5, wherein the source contact further includes a third portion that corresponds to the capping insulating layer, and
   wherein the third portion is wider than the second portion.

7. The semiconductor device of claim 4, wherein the insulating spacer includes protrusions that protrude toward the conductive layers.

8. The semiconductor device of claim 4, further comprising:
   a protective layer interposed between the insulating spacer and the source structure.

9. The semiconductor device of claim 1, further comprising:
   data storage patterns interposed between the channel layer and the conductive layers, and separated from each other by the insulating layers; and
   a tunnel insulating layer surrounding a sidewall of the channel layer, interposed between the channel layer and the data storage patterns and interposed between the channel layer and the insulating layers.

10. The semiconductor device of claim 1, further comprising:
a first dummy memory pattern interposed between the channel layer and the source structure; and
a first sacrificial pattern interposed between the first dummy memory pattern and the source structure.

11. The semiconductor device of claim 1, wherein the dummy memory pattern is extended between the channel layer and the uppermost insulating layer.

12. The semiconductor device of claim 11, further comprising:
a second sacrificial pattern interposed between the dummy memory pattern and the capping insulating layer.

13. The semiconductor device of claim 12, wherein the conductive layers include fourth sidewalls that face the channel layer,
wherein the second sacrificial pattern includes a fifth sidewall facing the channel layer, and
wherein the fourth sidewalls are aligned with the fifth sidewall.

* * * * *